(12) United States Patent
Lee et al.

(10) Patent No.: US 12,548,497 B2
(45) Date of Patent: Feb. 10, 2026

(54) DISPLAY APPARATUS INCLUDING SUB-DRIVING CIRCUIT PORTION AND MAIN DRIVING CIRCUIT PORTION

(71) Applicant: Samsung Display Co., Ltd., Yongin-Si (KR)

(72) Inventors: Yonghee Lee, Yongin-si (KR); Jihye Lee, Yongin-si (KR); Jinseon Kwak, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 27 days.

(21) Appl. No.: 18/613,106

(22) Filed: Mar. 22, 2024

(65) Prior Publication Data

US 2024/0321184 A1    Sep. 26, 2024

(30) Foreign Application Priority Data

Mar. 24, 2023  (KR) .......... 10-2023-0039234
Jun. 14, 2023  (KR) .......... 10-2023-0076424

(51) Int. Cl.
*G09G 3/32*    (2016.01)

(52) U.S. Cl.
CPC ....... *G09G 3/32* (2013.01); *G09G 2310/0267* (2013.01)

(58) Field of Classification Search
CPC .......... G09G 3/32; G09G 2310/0267
See application file for complete search history.

(56) References Cited

U.S. PATENT DOCUMENTS

| 10,964,761 | B2  | 3/2021  | Lee et al. |
| 2017/0219895 | A1* | 8/2017 | Yu .......... G09G 3/2092 |
| 2018/0356668 | A1* | 12/2018 | Koide ........ G02F 1/13338 |
| 2021/0048699 | A1* | 2/2021 | Yamada ........ H05K 1/189 |
| 2022/0270553 | A1  | 8/2022  | Kim et al. |

FOREIGN PATENT DOCUMENTS

| CN | 115457912 A | 12/2022 |
| KR | 10-2021-0127283 A | 10/2021 |
| KR | 10-2483346 B1 | 1/2023 |

* cited by examiner

*Primary Examiner* — Afroza Chowdhury
(74) *Attorney, Agent, or Firm* — Innovation Counsel LLP

(57) ABSTRACT

A display apparatus is disclosed that includes a substrate including a pixel circuit area and a driving circuit region, a sub-gate driving circuit disposed over the pixel circuit area, a main gate driving circuit arranged on a left side or a right side of the pixel circuit area, a main gate signal output line configured to transfer an output signal of the main gate driving circuit, a sub-gate signal output line configured to transfer an output signal of the sub-gate driving circuit, and a plurality of input lines crossing the main gate signal output line, wherein the plurality of input lines extend to cross the sub-gate signal output line.

21 Claims, 18 Drawing Sheets

DISPLAY APPARATUS INCLUDING SUB-DRIVING CIRCUIT PORTION AND MAIN DRIVING CIRCUIT PORTION

CROSS-REFERENCE TO RELATED APPLICATIONS

This application is based on and claims priority under 35 U.S.C. § 119 to Korean Patent Application Nos. 10-2023-0039234, filed on Mar. 24, 2023, and 10-2023-0076424, filed on Jun. 14, 2023, in the Korean Intellectual Property Office, the disclosures of which are incorporated by reference herein in their entireties.

BACKGROUND

1. Field

One or more embodiments relate to a structure of a display apparatus, and more particularly, to a display apparatus with an extended display area.

2. Description of the Related Art

Recently, the design of display apparatuses has diversified. As an example, a curved display apparatus, a foldable display apparatus, and a rollable display apparatus have been developed. In addition, a display area tends to be extended and a non-display area tends to be reduced. Accordingly, various methods have been derived to design the shape of the display apparatus.

SUMMARY

One or more embodiments may provide a display apparatus with an extended display area such that images may be displayed across a display area that includes corner regions and a reduced peripheral area. However, this is an example, and the disclosure is not limited thereto.

Additional aspects will be set forth in part in the description which follows and, in part, will be apparent from the description, or may be learned by practice of the presented embodiments of the disclosure.

According to one or more embodiments, a display apparatus includes a substrate including a pixel circuit area and a driving circuit region, wherein a pixel circuit is arranged in the pixel circuit area, and a driving circuit is arranged outside the pixel circuit and arranged in the driving circuit region, a sub-driving circuit portion including a sub-gate driving circuit, wherein the sub-driving circuit portion is disposed over the pixel circuit area when viewed in a direction perpendicular to the substrate, a main driving circuit portion arranged on a left side or a right side of the pixel circuit area when viewed in a direction perpendicular to the substrate, wherein the main driving circuit portion includes a main gate driving circuit arranged apart from the sub-gate driving circuit, a main gate signal output line configured to transfer a gate initialization signal from the main gate driving circuit to the pixel circuit, a sub-gate signal output line configured to transfer a gate initialization signal from the sub-gate driving circuit to the pixel circuit, and a plurality of input lines arranged between the main gate driving circuit and the pixel circuit and crossing the main gate signal output line, wherein the plurality of input lines extend to cross the sub-gate signal output line between the sub-gate driving circuit and the pixel circuit.

The main driving circuit portion may further include an emission driving circuit and a scan driving circuit.

The scan driving circuit may be arranged closer to an inside than the main gate driving circuit, and the emission driving circuit may be arranged closer to an outside than the main gate driving circuit.

The sub-gate driving circuit may include five to seven gate stages.

The main driving circuit portion may include a first main driving circuit portion arranged on a left side of the pixel circuit area, and a second main driving circuit portion arranged on a right side of the pixel circuit area, and the sub-driving circuit portion may include a first sub-driving circuit portion arranged a left end of an upper region of the pixel circuit area, and a second sub-driving circuit portion arranged on a right end of the upper region of the pixel circuit area.

The plurality of input lines may include a plurality of scan clock lines.

A scan clock line of the plurality of scan clock lines arranged between the main gate driving circuit and the pixel circuit may include a lower scan clock line and an upper scan clock line overlapping each other, and a scan clock line of the plurality of scan clock lines arranged between the sub-gate driving circuit and the pixel circuit may be disposed on a substantially same layer as a layer on which the lower scan clock line is disposed.

An area in which the main gate signal output line and the plurality of scan clock lines overlap each other may be equal to an area in which the sub-gate signal output line and the plurality of scan clock lines overlap each other.

The plurality of input lines may include a gate voltage line and an initialization voltage line.

The gate voltage line may include a gate-high voltage line and a gate-low voltage line, and the initialization voltage line may include a first initialization voltage line and a second initialization voltage line.

The gate voltage line arranged between the main gate driving circuit and the pixel circuit may be disposed on a same layer as a layer on which the gate voltage line arranged between the sub-gate driving circuit and the pixel circuit is disposed.

The initialization voltage line arranged between the main gate driving circuit and the pixel circuit may be disposed on a same layer as a layer on which the initialization voltage line arranged between the sub-gate driving circuit and the pixel circuit is disposed.

An area in which the main gate signal output line and the gate voltage line overlap each other may be equal to an area in which the sub-gate signal output line and the gate voltage line overlap each other.

An area in which the main gate signal output line and the initialization voltage line overlap each other may be equal to an area in which the sub-gate signal output line and the initialization voltage line overlap each other.

The main gate signal output line may include a main bridge line overlapping the initialization voltage line and extending in a direction crossing a direction in which the main gate signal output line extends, and the sub-gate signal output line may include a sub-bridge line overlapping the initialization voltage line and extending in a direction crossing a direction in which the sub-gate signal output line extends.

An area in which the main bridge line overlaps the initialization voltage line may be equal to an area in which the sub-bridge line overlaps the initialization voltage line.

The pixel circuit may include a first transistor including a polycrystalline semiconductor layer, and a third transistor including an oxide semiconductor layer.

The display apparatus may further include a first semiconductor layer disposed on the substrate and including a channel region of the first transistor, a first gate insulating layer disposed on the first semiconductor layer, a first gate electrode of the first transistor disposed on the first gate insulating layer and overlapping a channel of the first transistor, a first interlayer insulating layer disposed on the first gate electrode of the first transistor, a lower gate electrode of the third transistor disposed on the first interlayer insulating layer, a second interlayer insulating layer disposed on the lower gate electrode of the third transistor, a second semiconductor layer disposed on the second interlayer insulating layer and including a channel region of the third transistor, a second gate insulating layer disposed on the second semiconductor layer, an upper gate electrode of the third transistor disposed on the second gate insulating layer, a third interlayer insulating layer covering the upper gate electrode of the third transistor, a first source electrode of the first transistor disposed on the third interlayer insulating layer, a first organic insulating layer disposed on the first source electrode, and a connection electrode disposed on the first organic insulating layer.

The main gate signal output line and the sub-gate signal output line may be disposed on a substantially same layer as a layer on which the lower gate electrode of the third transistor is disposed.

The display apparatus may further include a plurality of gate signal connection lines connecting each of the main gate signal output line and the sub-gate signal output line to the pixel circuit, wherein the plurality of gate signal connection lines may be disposed on a substantially same layer as a layer on which the upper gate electrode of the third transistor is disposed.

The plurality of input lines may include a scan clock line, a gate voltage line, and an initialization voltage line, wherein the scan clock line may be disposed on a substantially same layer as a layer on which the first source electrode is disposed, and the gate voltage line and the initialization voltage line may be disposed on a substantially same layer as a layer on which the connection electrode is disposed.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
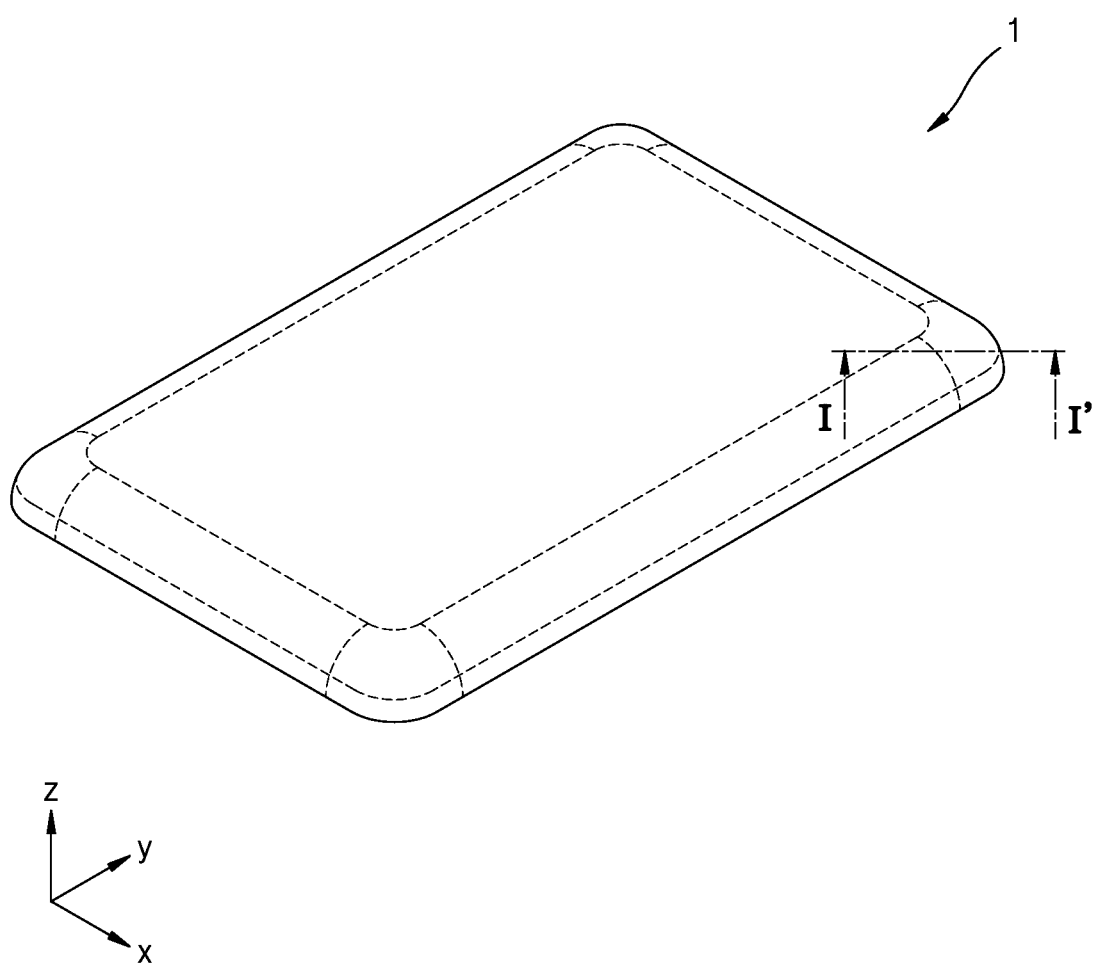
FIG. 1 is a schematic perspective view of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

As used herein, the word "or" means logical "or" so that, unless the context indicates otherwise, the expression "A, B, or C" means "A and B and C," "A and B but not C," "A and C but not B," "B and C but not A," "A but not B and not C," "B but not A and not C," and "C but not A and not B." Throughout the disclosure, the expression "at least one of a, b or c" indicates only a, only b, only c, both a and b, both a and c, both b and c, all of a, b, and c, or variations thereof.

As the disclosure allows for various changes and numerous embodiments, certain embodiments will be illustrated in the drawings and described in the written description. Effects and features of the disclosure, and methods for achieving them will be clarified with reference to embodiments described below in detail with reference to the drawings. However, the disclosure is not limited to the following embodiments and may be embodied in various forms.

Hereinafter, embodiments will be described with reference to the accompanying drawings, wherein like reference numerals refer to like elements throughout and a repeated description thereof is omitted.

While such terms as "first" and "second" may be used to describe various elements, such elements must not be limited to the above terms. The above terms are used to distinguish one element from another.

It will be understood that the terms "comprise," "comprising," "include" and "including" as used herein specify the presence of stated features or elements but do not preclude the addition of one or more other features or elements.

It will be further understood that, when a layer, region, or element is referred to as being "on" another layer, region, or element, it can be directly or indirectly on the other layer, region, or element. That is, for example, intervening layers, regions, or elements may be present.

Sizes of elements in the drawings may be exaggerated or reduced for convenience of explanation. As an example, the size and thickness of each element shown in the drawings are arbitrarily represented for convenience of description, and thus, the disclosure is not necessarily limited thereto.

In the case where a certain embodiment may be implemented differently, a specific process order may be performed in the order different from the described order. As an example, two processes successively described may be simultaneously performed substantially and performed in the opposite order.

It will be understood that when a layer, region, or element is referred to as being "connected" to another layer, region, or element, it may be "directly connected" to the other layer, region, or element or may be "indirectly connected" to the other layer, region, or element with another layer, region, or element located therebetween. For example, it will be understood that when a layer, region, or element is referred to as being "electrically connected" to another layer, region, or element, it may be "directly electrically connected" to the other layer, region, or element or may be "indirectly electrically connected" to the other layer, region, or element with another layer, region, or element disposed therebetween.

FIG. 1 is a schematic perspective view of a display apparatus 1 according to an embodiment.

Referring to FIG. 1, the display apparatus 1 is an apparatus for displaying moving images or still images and may include portable electronic apparatuses such as mobile phones, smartphones, tablet personal computers, mobile communication terminals, electronic organizers, electronic books, portable multimedia players (PMPs), navigations, and ultra mobile personal computers (UMPCs), and the like. In addition, the display apparatus 1 may be an electronic apparatus configured to provide a display screen such as televisions, notebook computers, monitors, advertisement boards, Internet of things (IoTs), and the like. Alternatively, the display apparatus 1 may be wearable devices including smartwatches, watchphones, glasses-type displays, or head-mounted displays (HMDs).

In an embodiment, the display apparatus 1 may have a quadrangular shape in a plan view. In an embodiment, the display apparatus 1 may have various shapes such as triangles, polygons such as quadrangles, circular shapes, elliptical shapes, and the like. In an embodiment, in the case where the display apparatus 1 has a polygonal shape in a plan view, the corners of the polygon may be round. Hereinafter, for convenience of description, the case where the display apparatus 1 has a quadrangular shape in which the corners are round in a plan view is mainly described.

The display apparatus 1 may have short sides in a first direction (e.g., an x direction or a −x direction) and long sides in a second direction (e.g., a y direction or a −y direction). In another embodiment, the length of the sides in the first direction (e.g., the x direction or the −x direction) of the display apparatus 1 and the length of the sides in the second direction (e.g., the y direction or the −y direction) may be the same. In another embodiment, the display apparatus 1 may have long sides in the first direction (e.g., the x direction or the −x direction) and short sides in the second direction (e.g., the y direction or the −y direction). Each corner at which the short side in the first direction (e.g., the x direction or the −x direction) and the long side in the second direction (e.g., the y direction or the −y direction) meet each other may be round to have a preset curvature.

Figure 2:
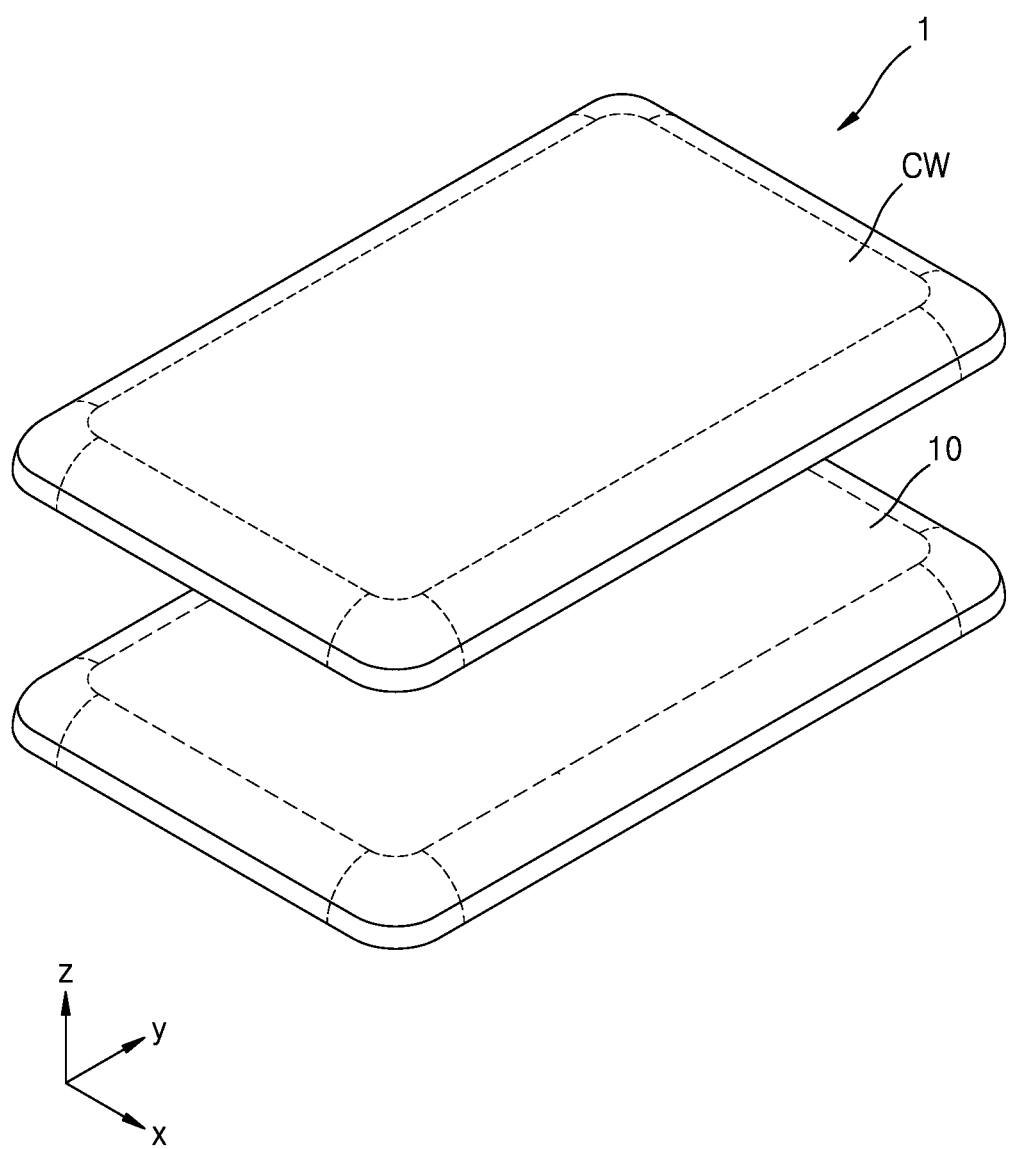
FIG. 2 is a schematic exploded perspective view of a display panel and a cover window of a display apparatus according to an embodiment.
Figure 3A:
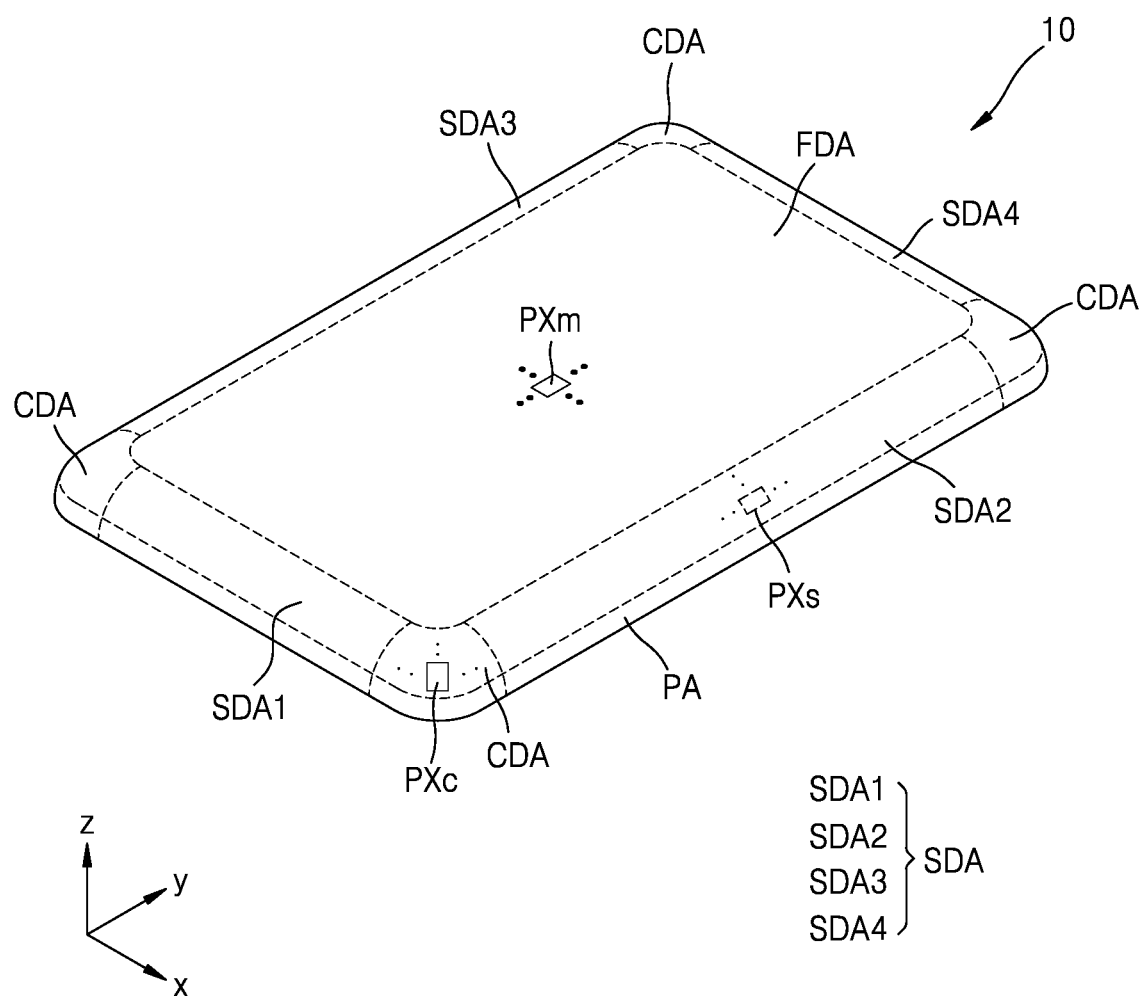
FIGS. 3A and 3B are schematic perspective views of a display apparatus according to an embodiment.
Figure 3B:
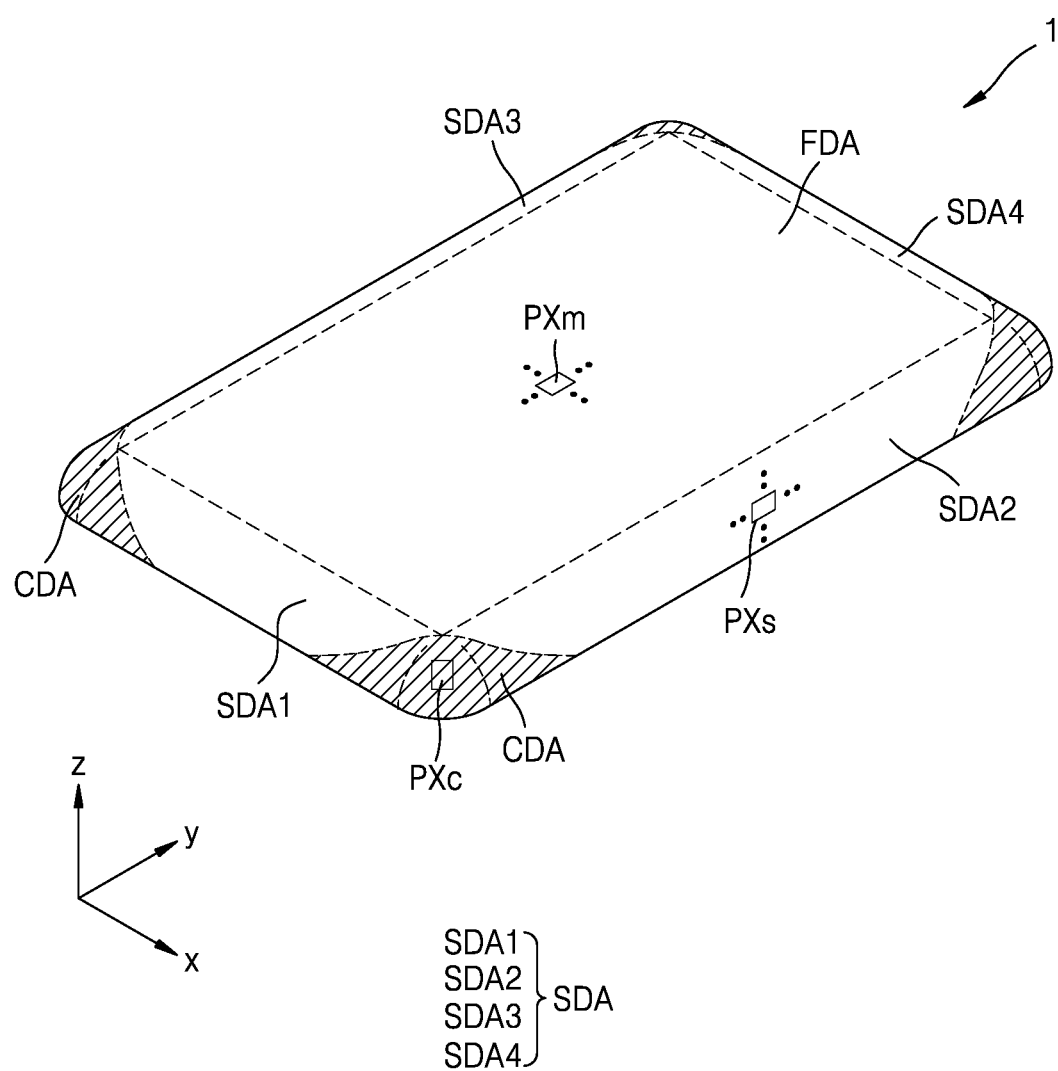
Figure 4:
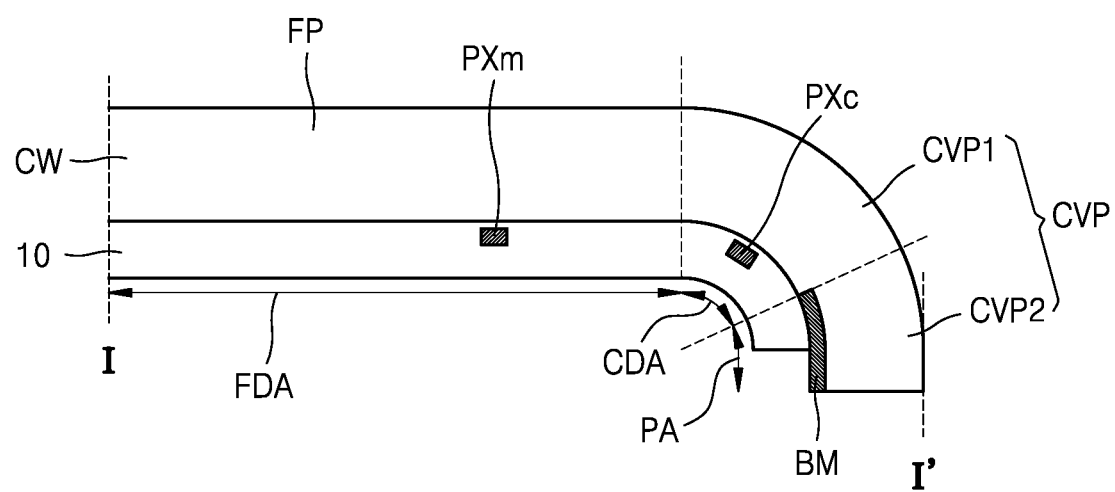
FIG. 4 is a cross-sectional view of the display apparatus, taken along line I-I' of FIG. 1.

FIG. 2 is a schematic exploded perspective view of a display panel 10 and a cover window CW of the display apparatus 1 according to an embodiment. FIGS. 3A and 3B are schematic perspective views of the display panel 10 of the display apparatus according to an embodiment. FIG. 4 is a cross-sectional view of the display apparatus, taken along line I-I' of FIG. 1.

Referring to FIGS. 2 to 4, the display apparatus 1 may include the display panel 10 and the cover window CW disposed on the display panel 10.

The display panel 10 may include a front display area FDA, a side display area SDA, and a corner display area CDA as a display area. The display apparatus 1 may include a peripheral area PA surrounding the display area.

The front display area FDA is a region disposed on the front portion of the display panel 10 and is a region formed flat without being bent. The front display area FDA may occupy the largest ratio in the display area of the display panel 10 and accordingly provide most of images. That is, the front display area FDA may be a main display area. The front display area FDA may have a rectangular shape including short sides in the x direction, long sides in the y direction, and round each corner.

At least a portion of the side display area SDA is bent to include a curved surface and may extend to the outside from each side of the front display area FDA. The side display area SDA may include a first side display area SDA1, a second side display area SDA2, a third side display area SDA3, and a fourth side display area SDA4. In an embodiment, at least one of the first side display area SDA1, the second side display area SDA2, the third side display area SDA3, and the fourth side display area SDA4 may be omitted.

The first side display area SDA1 may be a region extending from a first side of the front display area FDA and bent at a preset curvature. The first side display area SDA1 may extend from the lower side of the front display area FDA. The first side display area SDA1 may be a region disposed on the lower side surface of the display panel 10.

The second side display area SDA2 may be a region extending from a second side of the front display area FDA and bent at a preset curvature. The second side display area SDA2 may extend from the right side of the front display area FDA. The second side display area SDA2 may be a region disposed on the right side surface of the display panel 10.

The third side display area SDA3 may be a region extending from a third side of the front display area FDA and bent at a preset curvature. The third side display area SDA3 may extend from the left side of the front display area FDA. The third side display area SDA3 may be a region disposed on the left side surface of the display panel 10.

The fourth side display area SDA4 may be a region extending from a fourth side of the front display area FDA and bent at a preset curvature. The fourth side display area SDA4 may extend from the upper side of the front display area FDA. The fourth side display area SDA4 may be a region disposed on the upper side surface of the display panel 10.

The first to fourth side display areas SDA1, SDA2, SDA3, and SDA4 may each include a curved surface bent at a preset curvature. As an example, the first side display area SDA1 and the fourth side display area SDA4 may each have a curved surface bent around a bending axis extending in the x direction, and the second side display area SDA2 and the third side display area SDA3 may each have a curved surface bent around a bending axis extending in the y direction. The curvatures of the first to fourth side display areas SDA1, SDA2, SDA3, and SDA4 may be the same or different from each other.

The corner display area CDA may be a region extending from the corner of the front display area FDA and bent at a preset curvature. The corner display area CDA may be arranged between the first to fourth side display areas SDA1, SDA2, SDA3, and SDA4. As an example, the corner display area CDA may be arranged between the first side display area SDA1 and the second side display area SDA2, between the first side display area SDA1 and the third side display area SDA3, between the second side display area SDA2 and the fourth side display area SDA4, and between the third side display area SDA3 and the fourth side display area SDA4.

Because the corner display area CDA is located between the adjacent side display areas SDA having curved surfaces bent in different directions, the corner display area CDA may include a curved surface in which curved surfaces bent in various directions are continuously connected. In addition, in the case where the curvatures of the adjacent side display areas SDA are different from each other, the curvature of the corner display area CDA may gradually change along the edge of the display apparatus 1. As an example, in the case where the curvature of the first side display area SDA1 is different from the curvature of the second side display area SDA2, the corner display area CDA between the first side display area SDA1 and the second side display area SDA2 may have a curvature gradually changing depending on a position thereof.

The display panel 10 may be configured to display images using main pixels PXm arranged in the front display area FDA, side pixels PXs arranged in the side display area SDA, and corner pixels PXc arranged in the corner display area CDA. Because the display panel 10 is configured to display images in the side display area SDA and the corner display area CDA in addition to the front display area FDA, the proportion of the display area in the display apparatus 1 may increase. That is, in the display apparatus 1 having the same size, the area of the peripheral area PA may be reduced, and the area of the display area may be increased.

The peripheral area PA may be arranged to surround the outside of the side display area SDA and the corner display area CDA entirely or partially. The peripheral area PA is a region in which images are not displayed. Various wirings and driving circuits may be arranged in the peripheral area PA. A shield such as a light-blocking member may be provided in the peripheral area PA such that members disposed in the peripheral area PA are not visually recognized.

Referring to FIG. 4, the cover window CW may be disposed on the front surface of the display panel 10. Here, the 'front surface' of the display panel 10 may be defined as a surface facing a direction in which the display panel 10 is configured to display images.

The cover window CW may cover and protect the display panel 10. The cover window CW may have a high transmittance to transmit light emitted from the display panel 10, and have a thin thickness to reduce the weight of the display apparatus 1. In addition, the cover window CW may have high strength and hardness to protect the display panel 10 from external impacts.

The cover window CW may include a transparent material. The cover window CW may include, for example, glass or plastic. In the case where the cover window CW includes plastic, the cover window CW may be flexible. As an example, the cover window CW may be an ultra-thin glass (UTG®) whose strength is strengthened by a method such as chemical strengthening or thermal strengthening. In another embodiment, the cover window CW may be, for example, ultra-thin glass (UTG®) or colorless polyimide (CPI). In an embodiment, the cover window CW may have a structure in which a flexible polymer layer is disposed on one surface of a glass substrate, or include only a polymer layer.

The cover window CW may include a flat portion FP and a curved portion CVP, wherein the flat portion FP corresponds to the front display area FDA of the display panel 10, and the covered portion CVP corresponds to the corner display area CDA.

The flat portion FP of the cover window CW may be provided as a plane and may overlap the front display area FDA of the display panel 10. The curved portion CVP of the cover window CW may include a curved surface. In this case, the curved portion CVP may have a preset curvature or a varying curvature. The curved portion CVP may include a first curved portion CVP1 and a second curved portion CVP2. The first curved portion CVP1 may be arranged to overlap the side display area SDA and the corner display area CDA of the display panel 10. The second curved portion CVP2 may be arranged to overlap the peripheral area PA of the display panel 10. The first curved portion CVP1 may be arranged between the flat portion FP and the second curved portion CVP2.

A light-blocking member BM may be disposed in a portion of the second curved portion CVP2 of the cover window CW. The light-blocking member BM is intended to hide a lower structure disposed thereunder and may overlap the peripheral area PA of the display panel 10. The light-blocking member BM may include a light-blocking material. The light-blocking member BM may include carbon black, carbon nano tubes, and resin including black dye. Alternatively, the light-blocking member BM may include nickel, aluminum, molybdenum, and an alloy thereof. The light-blocking member BM may be coated using inkjet or attached in a film type.

The display panel 10 may be disposed under the cover window CW. The cover window CW and the display panel 10 may be coupled to each other by an adhesive member (not shown). The adhesive member may be an optically cleared adhesive film (OCA) or an optically cleared resin (OCR).

The display panel 10 may be configured to display images using the main pixels PXm arranged in the front display area FDA and the corner pixels PXc arranged in the corner display area CDA. A lower protective film (not shown) may be further disposed under the display panel 10 to protect the display panel 10.

Figure 5:
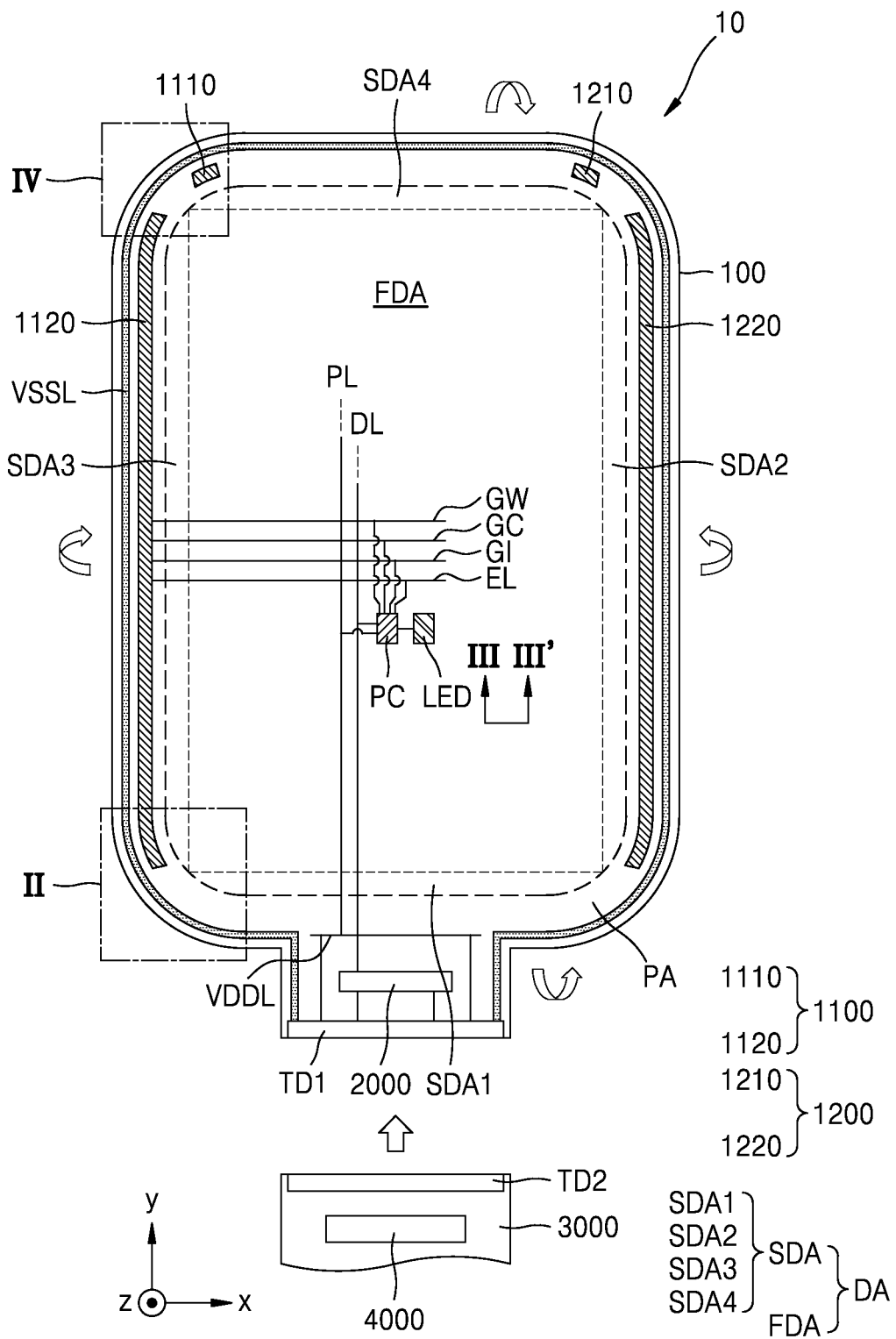
FIG. 5 is a schematic plan view of a display panel of a display apparatus according to an embodiment.

FIG. 5 is a schematic plan view of the display panel 10 of the display apparatus 1 according to an embodiment. For convenience of description, FIG. 5 shows a state in which the display panel 10 is not bent, for example, a state before the display panel 10 is bent.

Referring to FIG. 5, the display panel 10 may include the display area DA and the peripheral area PA. The shape of the display panel 10 of FIG. 5 may be actually the same as the shape of a substrate 100. When the display panel 10 includes the display area DA and the peripheral area PA, it may mean that the substrate 100 includes the display area DA and the peripheral area PA. The display area DA may include a round corner, and the substrate 100 may have a round corner entirely along the round corner of the display area DA.

The display panel 10 may include the front display area FDA and the first to fourth side display areas SDA1, SDA2, SDA3, and SDA4. As described above with reference to FIGS. 3A and 3B, the first to fourth side display areas SDA1, SDA2, SDA3, and SDA4 may each have an image plane different from the image plane of the front display area FDA.

The display area DA may be configured to display images by using light emitted from light-emitting diodes LED arranged in the display area DA. Each light-emitting diode LED arranged in the display area DA may be electrically connected to a pixel circuit PC arranged in the display area DA. The pixel circuit PC may include a signal line, transistors and a capacitor electrically connected to a power line, wherein the signal line is configured to control turning on/off and brightness, and the like of the light-emitting diode LED. As an example, as shown in FIG. 5, the pixel circuit PC may be electrically connected to a scan line GW, an emission control line EL, a compensation gate line GC, an initialization gate line GI, a data line DL, and a driving voltage line PL. Although FIG. 5 shows the light-emitting diode LED and the pixel circuit PC arranged in the front display area FDA, the light-emitting diode LED and the pixel circuit PC may be arranged also in the first to fourth side display areas SDA1, SDA2, SDA3, and SDA4.

A common voltage supply line VSSL, a driving voltage supply line VDDL, a first driving circuit portion 1100, a second driving circuit portion 1200, a data driving circuit portion 2000, and a first terminal portion TD1 may be arranged in the peripheral area PA.

The common voltage supply line VSSL may have a loop shape having one open side and partially surrounding the edges of the display area DA. As an example, the common voltage supply line VSSL may have a loop shape having one open side corresponding to the first terminal portion TD1 and extending along the third side display area SDA3, the second side display area SDA2, the first side display area SDA1, and the fourth side display area SDA4.

The driving voltage supply line VDDL may be located between one side of the display area DA and the first terminal portion TD1. With regard to this, although it is shown that the driving voltage supply line VDDL is arranged between the first side display area SDA1 and the first terminal portion TD1, the driving voltage supply line VDDL may further include a portion arranged between the fourth side display area SDA4 and the edge of the substrate 100 in another embodiment. The driving voltage line PL crossing the display area DA may be electrically connected to the driving voltage supply line VDDL.

The first driving circuit portion 1100 and the second driving circuit portion 1200 may be arranged in the peripheral area PA, and adjacent to two opposite sides of the display area DA, respectively. The first driving circuit portion 1100 may be arranged adjacent to the third side display area SDA3, and the second driving circuit portion 1200 may be arranged adjacent to the second side display area SDA2.

The first driving circuit portion 1100 may include a plurality of driving circuits. Some of the plurality of driving circuits may be scan driving circuits configured to provide scan signals to the scan line GW, others may be emission control driving circuits configured to provide emission control signals to the emission control line EM, and others may be gate driving circuits configured to provide signals to the compensation gate line GC and the initialization gate line GI.

Figure 6A:
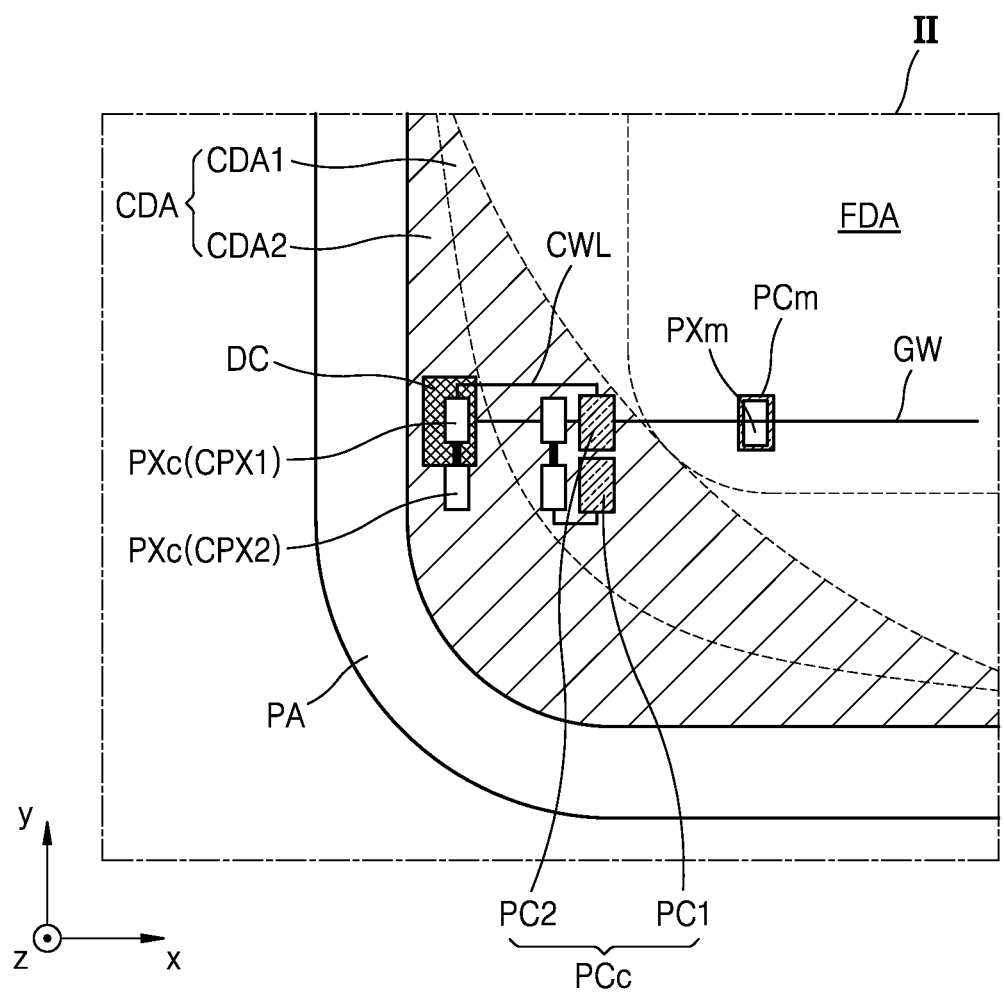
FIG. 6A is a schematic enlarged plan view of a portion of a display apparatus showing an embodiment of a region II of FIG. 5.

Most of the driving circuits included in the first driving circuit portion 1100 may be arranged in the peripheral area PA in an extension direction of the third side display area SDA3, and some of the driving circuits may be arranged in the corner display area CDA (see FIG. 6A). In addition, most of the driving circuits included in the first driving circuit portion 1100 may be arranged in an extension direction of the third side display area SDA3, and some of the driving circuits may be mostly arranged apart from most of the driving circuits. With regard to this, it is shown in FIG. 5 that the first driving circuit portion 1100 includes a first main driving circuit portion 1120 and a first sub-driving circuit portion 1110 apart from the first main driving circuit portion 1120. The first main driving circuit portion 1120 corresponds to a region in which most of the driving circuits described above are arranged, and the first sub-driving circuit portion 1110 corresponds to a region in which the driving circuits are spaced apart by a preset interval from the driving circuits of the first main driving circuit portion 1120. Specifically, the first sub-driving circuit portion 1110 may be arranged over a pixel circuit area in which the pixel circuits PC are arranged, and the first sub-driving circuit portion 1110 may be arranged apart by a preset interval from the first main driving circuit portion 1120.

Similarly, most of the driving circuits included in the second driving circuit portion 1200 may be arranged in the peripheral area PA in an extension direction of the second side display area SDA2, and some of the driving circuits may be also arranged in the corner display area CDA (see FIG. 6A). In addition, most of the driving circuits included in the second driving circuit portion 1200 may be arranged in the peripheral area PA in an extension direction of the second side display area SDA2, and some of the driving circuits may be mostly arranged apart from most of the driving circuits. Configuration of the driving circuits of the second driving circuit portion 1200 and configuration of the driving circuits of the first driving circuit portion 1100 may be symmetrical to each other. As an example, the first driving circuit portion 1100 and the second driving circuit portion 1200 may be symmetrical to each other with respect to a virtual line extending in the y direction and passing through the center of the front display area FDA of FIG. 5.

With regard to this, it is shown in FIG. 5 that the second driving circuit portion 1200 includes a second main driving circuit portion 1220 and a second sub-driving circuit portion 1210 apart from the second main driving circuit portion 1220. The second main driving circuit portion 1220 corresponds to a region in which most of the driving circuits described above are arranged, and the second sub-driving circuit portion 1210 corresponds to a region in which the driving circuits are spaced apart by a preset interval from the driving circuits of the second main driving circuit portion 1220. Specifically, the second sub-driving circuit portion 1210 may be arranged over the pixel circuit area in which the pixel circuits PC are arranged, and the second sub-driving circuit portion 1210 may be arranged apart by a preset interval from the second main driving circuit portion 1220.

The data driving circuit portion 2000 may be configured to transfer a data signal to one of the transistors of the pixel circuit PC through the data line DL passing across the display area DA. The data driving circuit portion 2000 may be arranged between the first terminal portion TD1 and the first side display area SDA1.

The first terminal portion TD1 may be located on one side of the substrate 100. A printed circuit board 3000 may be attached on the first terminal portion TD1. The printed circuit board 3000 may include a second terminal portion TD2 electrically connected to the first terminal portion TD1. A controller 4000 may be disposed on the printed circuit board 3000. Control signals of the controller 4000 may be provided to the first and second driving circuit portions 1100 and 1200, the data driving circuit portion 2000, the driving voltage supply line VDDL, and the common voltage supply line VSSL through the first and second terminal portions TD1 and TD2.

Figure 6B:
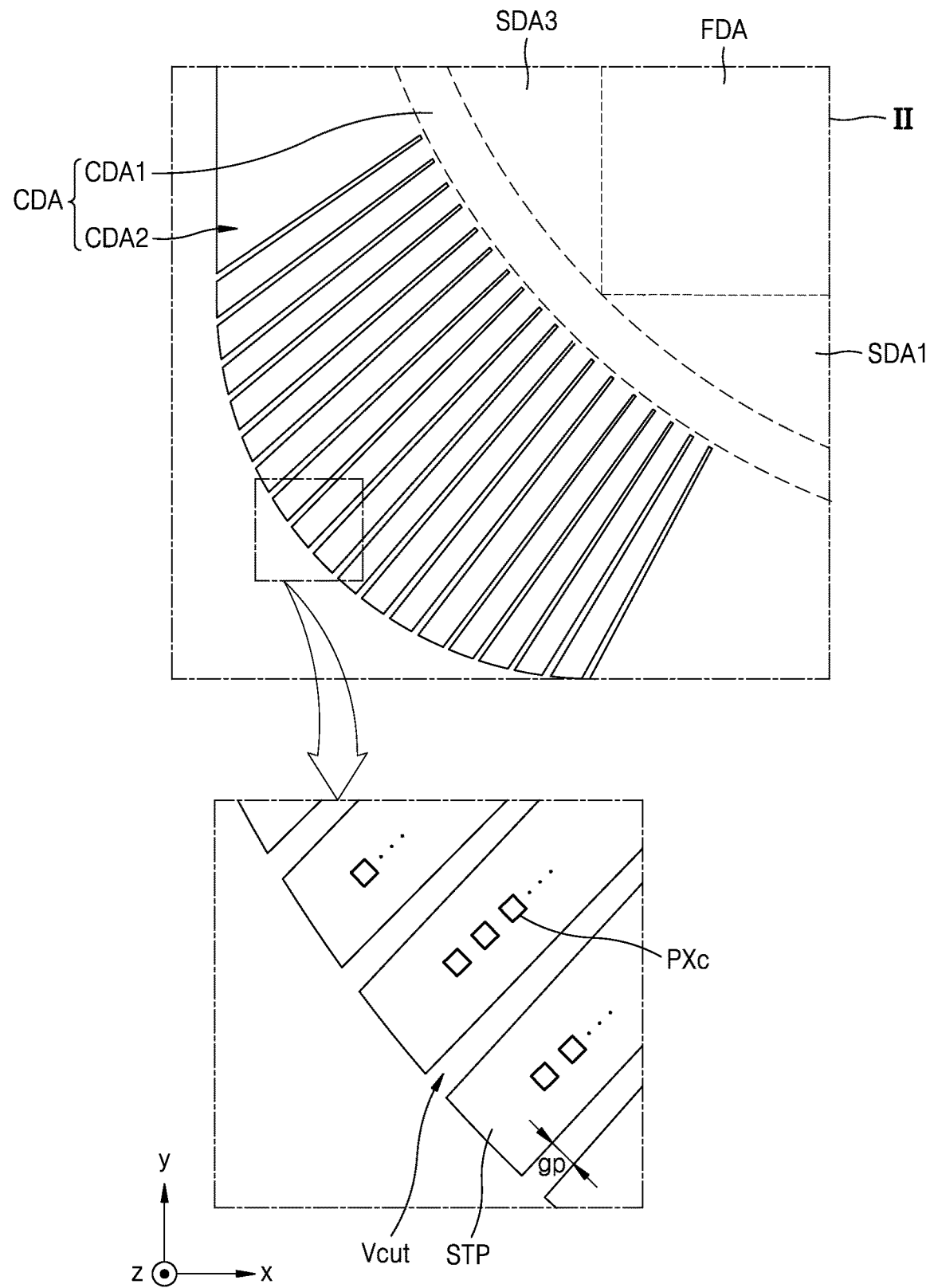
FIG. 6B is a schematic enlarged plan view of a portion of a display apparatus showing another embodiment of the region II of FIG. 5.

FIG. 6A is a schematic enlarged plan view of a portion of the display apparatus 1 according to an embodiment, and FIG. 6B is a schematic enlarged plan view of a portion of the display apparatus 1 according to another embodiment, showing a region II of FIG. 5.

Referring to FIGS. 6A and 6B, the display area DA may include the front display area FDA and the corner display area CDA. The corner display area CDA may be arranged in a region extending from the front display area FDA. The corner display area CDA may be arranged between two side display areas SDA (see FIG. 5). The plurality of corner pixels PXc may be arranged in the corner display area CDA, and corner images may be displayed using the corner pixels PXc. A corner image may form one entire image in cooperation with a main image and a side image. Alternatively, a corner image may be an image independent of the main image.

The corner display area CDA may include a first corner display area CDA1 and a second corner display area CDA2. The second corner display area CDA2 is a region extending from the first corner display area CDA1. The second corner display area CDA2 may be closer to the edge of the substrate 100 than the first corner display area CDA1. The first corner display area CDA1 may be arranged between the second corner display area CDA2 and the front display area FDA.

In an embodiment, as shown in FIG. 6A, the second corner display area CDA2 is a region extending from the first corner display area CDA1 and may be integrally formed without a cut portion. In addition, although a plurality of corner pixels PXc may be arranged in both the first corner display area CDA1 and the second corner display area CDA2, a corner pixel circuit PCc may be arranged in the first corner display area CDA1 and a corner pixel circuit PCc may not be arranged in the second corner display area CDA2.

Specifically, a portion of a driving circuit DC may be arranged in the second corner display area CDA2 in addition to the corner pixel PXc. The driving circuit DC arranged in the second corner display area CDA2 may be a scan driving circuit. That is, the driving circuit DC may be configured to provide scan signals for driving the main pixels PXm and the corner pixels PXc respectively arranged in the front display area FDA and the corner display area CDA. In an embodiment, the driving circuit DC may be simultaneously connected to a pixel circuit configured to drive the corner pixels PXc and a pixel circuit configured to drive the main pixel PXm to provide the same scan signals. In this case, a scan line GW connected to the driving circuit DC may extend from the second corner display area CDA2 to the front display area FDA. The scan line GW may extend in the x direction.

The corner pixel PXc may overlap the driving circuit DC in the second corner display area CDA2. The corner pixel circuit PCc configured to drive the corner pixel PXc arranged in the second corner display area CDA2 may be arranged in the first corner display area CDA1. Accordingly, pixel circuits PC1 and PC2 may be arranged in the first corner display area CDA1, wherein the pixel circuits PC1 and PC2 are configured to respectively drive the corner pixel PXc arranged in the first corner display area CDA1 and the corner pixel PXc arranged in the second corner display area CDA2. The corner pixel PXc arranged in the second corner display area CDA2 may be driven by being connected to the corner pixel circuit PCc through a connection line CWL, wherein the corner pixel circuit PCc is arranged in the first corner display area CDA1. The connection line CWL may extend in the x direction, which is a direction in which the scan line GW extends.

The corner pixel PXc arranged in the corner display area CDA may include a first copy pixel CPX1 and a second copy pixel CPX2. The first copy pixel CPX1 and the second copy pixel CPX2 are driven by one pixel circuit and may be pixels configured to emit light of the same color. The first copy pixel CPX1 and the second copy pixel CPX2 may be substantially the same in size. Because the corner pixels PXc are provided as copy pixels, the number of pixel circuits configured to drive the corner pixels PXc may be reduced. Because the corner pixels PXc are arranged to overlap the driving circuit DC, the corner display area CDA may be extended.

In another embodiment, as shown in FIG. 6B, the second corner display area CDA2 may include a plurality of strip portions STP and a plurality of cuttings Vcut. The plurality of cuttings Vcut are arranged between the plurality of strip portions STP and may be regions formed by cutting the substrate 100. The plurality of cuttings Vcut may be through portions passing through the display panel 10.

Ends of the plurality of strip portions STP may be arranged apart from each other at a preset gap gp. Empty spaces are formed between the plurality of strip portions STP by the gaps gp, and the empty spaces may respectively correspond to the plurality of cuttings Vcut. The gap gp between the plurality of strip portions STP is variable. As an example, as shown in FIG. 6B, the gap gp between the plurality of strip portions STP may increase from the front display area FDA to the corner display area CDA. As another example, the gap gp between the plurality of strip portions STP may be constant rather than variable. That is, the plurality of strip portions STP may be arranged radially or arranged in parallel to each other.

The plurality of strip portions STP may be connected to each other in a portion near the front display area FDA. The plurality of strip portions STP may extend from the front display area FDA. Extended lengths of the plurality of strip portions STP may be different from each other. Extended lengths of the plurality of strip portions STP may be different from each other depending on a distance by which the plurality of strip portions STP are apart from the central portion of the corner display area CDA. As an example, the strip portions STP arranged on the central portion among the plurality of strip portions STP may have a greater length extending to the corner display area CDA than the other strip portions STP. When each of the plurality of strip portions STP is arranged away from the center of the corner display area CDA, an extended length of each of the plurality of strip portions STP may be reduced.

Each cutting Vcut may pass through the front surface and the lower surface of the display panel 10 (see FIG. 5). Each cutting Vcut may increase flexibility of the display panel 10 (see FIG. 5). In addition, when external force (warping, bending, or drawing force and the like) is applied to the display panel 10 (see FIG. 5), the shapes of the cuttings Vcut change to reduce stress generation while the display panel 10 (see FIG. 5) is transformed, and thus, durability of the display panel 10 (see FIG. 5) may be improved.

In the case where external force is applied to the display panel 10 (see FIG. 5), the area or shape of the cutting Vcut may be changed, and the position of the strip portion STP may be changed. As an example, in the case where force bending the edges of the display panel 10 (see FIG. 5) and the corner sides therebetween is applied, because the gap gp between the plurality of strip portions STP is reduced, the area of the cutting Vcut may be reduced and the strip portions STP adjacent to each other may be in contact with each other.

In the case where external force is applied to the display panel 10 (see FIG. 5), the area and the like of the gap gp between the plurality of strip portions STP and the cutting Vcut may change, and the shape of the plurality of strip portions STP may not change. That is, the pixel circuit, the display element and the like may be disposed on each of the plurality of strip portions STP, and because the shapes of the plurality of strip portions STP do not changed even though external force is applied to the display panel 10 (see FIG. 5), the pixel circuit, the display element and the like disposed on each of the plurality of strip portions STP may be protected.

Because the shapes of the plurality of strip portions STP do not change, the corner pixels PXc may be arranged in the corner display area CDA of the display panel 10 (see FIG. 5) having a curvature. Through this configuration, the display area in which images are displayed may extended from the front display area FDA and the side display area SDA to the corner display area CDA. The corner pixels PXc disposed on the strip portion STP may be arranged apart from each other in one direction.

Figure 7:
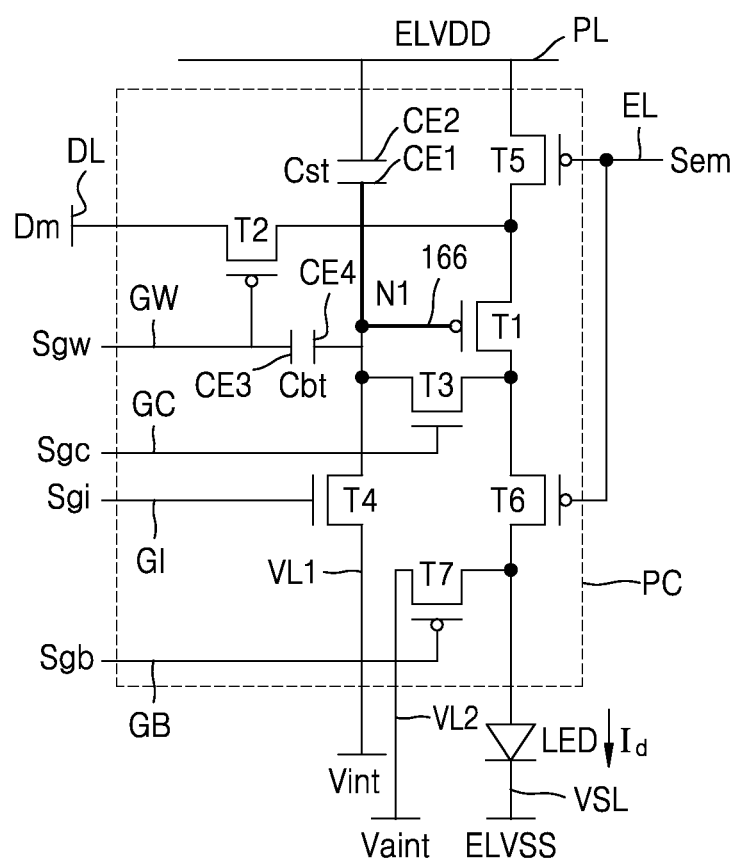
FIG. 7 is a schematic equivalent circuit diagram of a light-emitting diode and a pixel circuit electrically connected to the light-emitting diode arranged in the display area of the display apparatus according to an embodiment.

FIG. 7 is a schematic equivalent circuit diagram of a light-emitting diode and a pixel circuit electrically connected to the light-emitting diode arranged in the display area of the display apparatus according to an embodiment.

Referring to FIG. 7, the light-emitting diode LED may be electrically connected to the pixel circuit PC, and the pixel circuit PC may include seven transistors and two capacitors. The pixel circuit PC may include first to seventh transistors T1, T2, T3, T4, T5, T6, and T7, a storage capacitor Cst, and a boost capacitor Cbt. In another embodiment, the pixel circuit PC may not include the boost capacitor Cbt. A pixel electrode (e.g., an anode) of the light-emitting diode LED may be electrically connected to the first transistor T1 through the sixth transistor T6, and an opposite electrode (e.g., a cathode) may be electrically connected to an auxiliary line VSL and may receive a voltage corresponding to a common voltage ELVSS through the auxiliary line VSL.

The light-emitting diode LED may include an organic light-emitting diode including an organic emission layer. In another embodiment, the light-emitting diode LED may be an inorganic light-emitting diode including an inorganic material. The inorganic light-emitting diode may include a PN-junction diode including inorganic material semiconductor-based materials. When a forward voltage is applied to a PN-junction diode, holes and electrons are injected and energy created by recombination of the holes and the electrons is converted to light energy, and thus, light of a preset color may be emitted. The inorganic light-emitting diode may have a width of several micrometers to hundreds of micrometers, or several nanometers to hundreds of nanometers. An emission layer of the light-emitting diode LED may include the organic material or inorganic material. In another embodiment, the emission layer of the light-emitting diode LED may include quantum dots. In other words, the light-emitting diode LED may be a quantum-dot light-emitting diode.

Some of the transistors T1, T2, T3, T4, T5, T6, and T7 may be n-channel metal oxide semiconductor (NMOS) field-effect transistors (n-channel MOSFETs), and the rest may be p-channel metal oxide semiconductor (PMOS) field-effect transistors (p-channel MOSFETs). In an embodiment, as shown in FIG. 7, the third and fourth transistors T3 and T4 may be n-channel MOSFETs, and the rest may be p-channel MOSFETs. As an example, the third and fourth transistors T3 and T4 may be n-channel MOSFETs including an oxide-based semiconductor material, and the rest may be p-channel MOSFETs including a silicon-based semiconductor material. In another embodiment, the third, fourth, and seventh transistors T3, T4, and T7 may be n-channel MOSFETs, and the rest may be p-channel MOSFETs.

The first to seventh transistors T1, T2, T3, T4, T5, T6, and T7, the storage capacitor Cst, and the boost capacitor Cbt may be connected to signal lines. Signal lines may include the scan line GW, the emission control line EL, the compensation gate line GC, the initialization gate line GI, a next scan line GB, and the data line DL, wherein the scan line GW is configured to transfer a scan signal Sgw, the emission control line EM is configured to transfer an emission control signal Sem to the fifth transistor T5 and the sixth transistor T6, the compensation gate line GC is configured to transfer a compensation signal Sgc, the initialization gate line GI is configured to transfer an initialization signal Sgi to the fourth transistor T4, the next scan line GB is configured to transfer a next scan signal Sgb to the seventh transistor T7, and the data line DL is configured to transfer a data signal Dm. The pixel circuit PC may be electrically connected to a voltage line, for example, the driving voltage line PL, a first initialization voltage line VL1, and a second initialization voltage line VL2. The driving voltage line PL is configured to transfer a driving voltage ELVDD to the first transistor T1, and the first initialization voltage line VL1 and the second initialization voltage line VL2 are configured to respectively transfer initialization voltages Vint and Vaint initializing the first transistor T1 and the anode.

The first transistor T1 may be a driving transistor. A first gate electrode of the first transistor T1 may be connected to the storage capacitor Cst, a first electrode of the first transistor T1 may be electrically connected to the driving voltage line PL through the fifth transistor T5, and a second electrode of the first transistor T1 may be electrically connected to a first electrode (e.g., an anode) of the light-emitting diode LED through the sixth transistor T6. One of the first electrode and the second electrode of the first transistor T1 may be a source electrode, and the other may be a drain electrode. The first transistor T1 may be configured to supply the driving current $I_d$ to the light-emitting diode LED according to a switching operation of the second transistor T2.

The second transistor T2 may be a switching transistor. A second gate electrode of the second transistor T2 is connected to the scan line GW, a first electrode of the second transistor T2 is connected to the data line DL, and a second electrode of the second transistor T2 is connected to the driving first electrode of the first transistor T1 and electrically connected to the driving voltage line PL through the fifth transistor T5. One of the first electrode and the second electrode of the second transistor T2 may be a source electrode, and the other may be a drain electrode. The second transistor T2 may be turned on according to a scan signal Sgw transferred through the scan line GW and may perform a switching operation of transferring a data signal Dm to the first electrode of the first transistor T1, wherein the data signal Dm is transferred through the data line DL.

The third transistor T3 may be a compensation transistor configured to compensate for a threshold voltage of the first transistor T1. A third gate electrode of the third transistor T3 is connected to a compensation gate line GC. A first electrode of the third transistor T3 is connected to a lower electrode CE1 of the storage capacitor Cst through a node connection line 166, and connected to the first gate electrode of the first transistor T1. A first electrode of the third transistor T3 may be connected to the fourth transistor T4. A second electrode of the third transistor T3 is connected to the second electrode of the first transistor T1 and electrically connected to the first electrode (e.g., the anode) of the light-emitting diode LED through the sixth transistor T6. One of the first electrode and the second electrode of the third transistor T3 may be a source electrode, and the other may be a drain electrode. The third transistor T3 is turned on according to a compensation signal Sgc transferred through the compensation gate line GC, and diode-connects the first transistor T1 by electrically connecting the first gate electrode to the second electrode (e.g., a drain electrode) of the first transistor T1.

The fourth transistor T4 may be a first initialization transistor configured to initialize the first gate electrode of the first transistor T1. A fourth gate electrode of the fourth transistor T4 is connected to an initialization gate line GI. A first electrode of the fourth transistor T4 is connected to the first initialization voltage line VL1. A second electrode of the fourth transistor T4 may be connected to the lower electrode CE1 of the storage capacitor Cst, the first electrode of the third transistor T3, and the first gate electrode of the first transistor T1. One of the first electrode and the second electrode of the fourth transistor T4 may be a source electrode, and the other may be a drain electrode. The fourth transistor T4 may be turned on according to an initialization signal Sgi transferred through the initialization gate line GI and may perform an initialization operation of initializing the voltage of the first gate electrode of the first transistor T1 by transferring the first initialization voltage Vint to the first gate electrode of the driving transistor T1.

The fifth transistor T5 may be an operation control transistor. A fifth gate electrode of the fifth transistor T5 is connected to the emission control line EL, a first electrode of the fifth transistor T5 is connected to the driving voltage line PL, and a second electrode of the fifth transistor T5 is connected to the first electrode of the first transistor T1 and the second electrode of the second transistor T2. One of the first electrode and the second electrode of the fifth transistor T5 may be a source electrode, and the other may be a drain electrode.

The sixth transistor T6 may be an emission control transistor. A sixth gate electrode of the sixth transistor T6 is connected to the emission control line EM, a first electrode of the sixth transistor T6 is connected to the second electrode of the first transistor T1 and the second electrode of the third transistor T3, and a second electrode of the sixth transistor T6 is electrically connected to a second electrode of the seventh transistor T7 and the first electrode (e.g., the anode) of the light-emitting diode LED. One of the first electrode and the second electrode of the sixth transistor T6 may be a source electrode, and the other may be a drain electrode.

The fifth transistor T5 and the sixth transistor T6 may be simultaneously turned on according to an emission control signal Sem transferred through the emission control line EL, the driving voltage ELVDD is transferred to the light-emitting diode ED, and the driving current $I_d$ flows through the light-emitting diode ED.

The seventh transistor T7 may be a second initialization transistor configured to initialize the first electrode of the light-emitting diode LED. A seventh gate electrode of the seventh transistor T7 is connected to the next scan line GB. A first electrode of the seventh transistor T7 is connected to the second initialization voltage line VL2. A second electrode of the seventh transistor T7 is connected to the second electrode of the sixth transistor T6 and the first electrode (e.g., the anode) of the light-emitting diode LED. The seventh transistor T7 may be turned on according to a next scan signal Sgb transferred through the next scan line GB and may initialize the first electrode of the light-emitting diode LED by transferring the second initialization voltage Vaint to the first electrode (e.g., the anode) of the light-emitting diode LED.

A next scan signal Sgb may be substantially synchronized with a scan signal Sgw. As another example, a next scan signal Sgb may be substantially synchronized with a scan signal Sgw on a next row. As an example, a next scan line GB may be substantially the same as a scan line GW on a next row. The pixels adjacent to each other in a column direction may share the scan line GW.

The storage capacitor Cst includes the lower electrode CE1 and an upper electrode CE2. The lower electrode CE1 of the storage capacitor Cst is connected to the first gate electrode of the first transistor T1, and the upper electrode CE2 of the storage capacitor Cst is connected to the driving voltage line PL. The storage capacitor Cst may be configured to store charge corresponding to a difference between a voltage of the first gate electrode of the first transistor T1 and the driving voltage ELVDD.

The boost capacitor Cbt includes a third electrode CE3 and a fourth electrode CE4. The third electrode CE3 may be connected to the second gate electrode of the second transistor T2 and the scan line GW, and the fourth electrode CE4 may be connected to the first electrode of the third transistor T3 and the node connection line 166. The boost capacitor Cbt may raise the voltage of a first node N1 when a scan signal Sgw supplied to the scan line GW is turned off. When the voltage of the first node N1 is raised, a black grayscale may be clearly expressed. The first node N1 may be a region where the first gate electrode of the first transistor T1, the first electrode of the third transistor T3, the second electrode of the fourth transistor T4, and the fourth electrode CE4 of the boost capacitor Cbt are connected to each other.

In an embodiment, it is described in FIG. 7 that the third and fourth transistors T3 and T4 are n-channel MOSFETs, and the first, second, fifth to seventh transistors T1, T2, T5, T6, and T7 are p-channel MOSFETs. The first transistor T1 directly influencing the brightness of the display apparatus displaying images may be configured to include a semiconductor layer including polycrystalline silicon having high reliability, and thus, a high-resolution display apparatus may be implemented through this configuration.

Although it is described in FIG. 7 that some of the transistors are NMOSFETs and the rest are PMOSFETs, the embodiment is not limited thereto. In another embodiment, the pixel circuit PC includes three transistors and all of the three transistors may be NMOSFETs. However, various modifications may be made.

Figure 8:
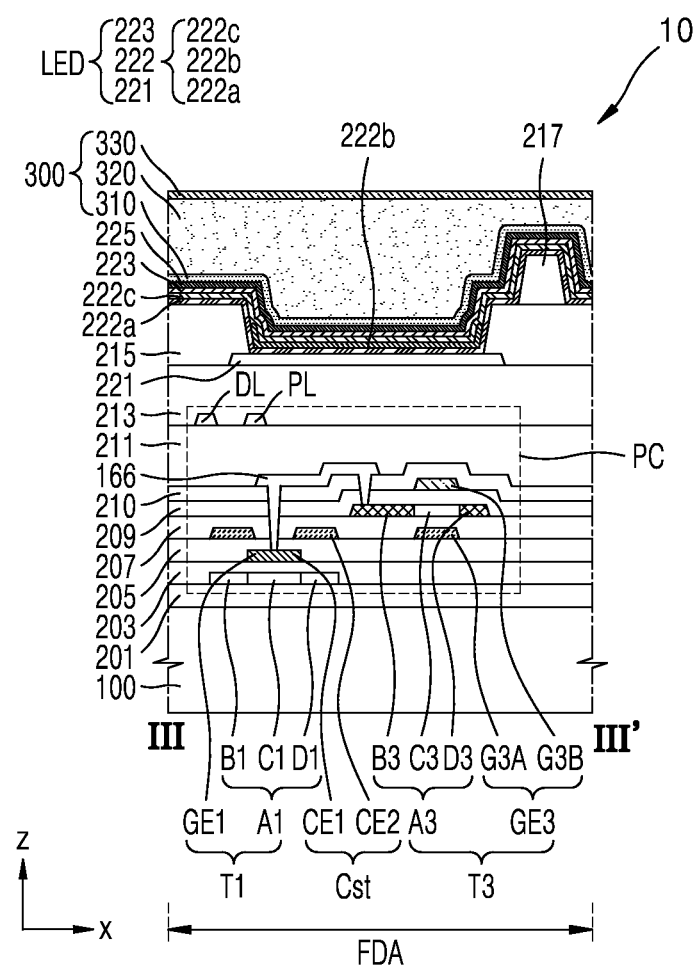
FIG. 8 is a schematic cross-sectional view of a portion of the display apparatus, taken along line III-III' of FIG. 5, according to an embodiment.

FIG. 8 is a schematic cross-sectional view of a portion of the display apparatus 1, taken along line III-III' of FIG. 5, according to an embodiment. Although FIG. 8 shows the pixel circuit PC and the light-emitting diode LED located in the front display area FDA (see FIG. 5), the embodiment is not limited thereto. The pixel circuit PC and the light-emitting diode LED arranged in the side display area SDA (see FIG. 5) and the corner display area CDA (see FIG. 6A) and described with reference to FIGS. 5 and 6B may also have the structure shown in FIG. 8.

Referring to FIG. 8, the pixel circuit PC may be disposed on the substrate 100, and the light-emitting diode LED may be disposed on the pixel circuit PC.

The substrate 100 may include glass or polymer resin. As an example, the polymer resin may include polyethersulfone, polyacrylate, polyetherimide, polyethylene naphthalate, polyethylene terephthalate, polyphenylene sulfide, polyarylate, polyimide, polycarbonate, cellulose acetate propionate, or the like. The substrate 100 including the polymer resin may be flexible, rollable, or bendable. The substrate 100 may have a multi-layered structure including a layer that includes the polymer resin and an inorganic layer (not shown).

A buffer layer 201 may be disposed on the upper surface of the substrate 100. The buffer layer 201 may prevent impurities from penetrating a semiconductor layer of a transistor. The buffer layer 201 may include an inorganic insulating material such as silicon nitride, silicon oxynitride, and silicon oxide, and include a single layer or a multi-layer including the above inorganic insulating materials.

The pixel circuit PC may be disposed on the buffer layer 201. As described above with reference to FIG. 7, the pixel circuit PC may include the plurality of transistors and the storage capacitor. With regard to this, FIG. 6 shows the first transistor T1, the third transistor T3, and the storage capacitor Cst.

The first transistor T1 may include the semiconductor layer (referred to as a first semiconductor layer A1) on the buffer layer 201, and a gate electrode (referred to as a first gate electrode GE1) overlapping a channel region C1 of the first semiconductor layer A1. The first semiconductor layer A1 may include a silicon-based semiconductor material, for example, polycrystalline silicon. The first semiconductor layer A1 may include the channel region C1, a first region B1, and a second region D1 respectively arranged on two opposite sides of the channel region C1. The first region B1 and the second region D1 are regions including impurities of higher concentration than the concentration of the channel region C1. One of the first region B1 and the second region D1 may correspond to a source region, and the other may correspond to a drain region.

A first gate insulating layer 203 may be arranged between the first semiconductor layer A1 and the first gate electrode GE1. The first gate insulating layer 203 may include an inorganic insulating material such as silicon nitride, silicon oxynitride, and silicon oxide, and include a single-layered structure or a multi-layered structure including the above inorganic insulating materials.

The first gate electrode GE1 may include a conductive material including molybdenum (Mo), aluminum (Al), copper (Cu), and titanium (Ti) and have a single-layered structure or a multi-layered structure including the above materials.

The storage capacitor Cst may include the lower electrode CE1 and the upper electrode CE2 overlapping each other. In an embodiment, the lower electrode CE1 of the storage capacitor Cst may include the first gate electrode GE1. In other words, the first gate electrode G1 may include the lower electrode CE1 of the storage capacitor Cst. As an example, the first gate electrode GE1 and the lower electrode CE1 of the storage capacitor Cst may be one body.

A first interlayer insulating layer 205 may be disposed between the lower electrode CE1 and the upper electrode CE2 of the storage capacitor Cst. The first interlayer insulating layer 205 may include an inorganic insulating material such as silicon nitride, silicon oxynitride, and silicon oxide, and include a single-layered structure or a multi-layered structure including the above inorganic insulating materials.

The upper electrode CE2 of the storage capacitor Cst may include a conductive material of a low-resistance material such as molybdenum (Mo), aluminum (Al), copper (Cu) or titanium (Ti), and have a single-layered structure or a multi-layered structure including the above materials.

A second interlayer insulating layer 207 may be disposed on the storage capacitor Cst. The second interlayer insulating layer 207 may include an inorganic insulating material such as silicon nitride, silicon oxynitride, and silicon oxide, and include a single-layered structure or a multi-layered structure including the above inorganic insulating materials.

A semiconductor layer (referred to as a third semiconductor layer A3) of the third transistor T3 may be disposed on the second interlayer insulating layer 207. The third semiconductor layer A3 may include an oxide-based semiconductor material. As an example, the third semiconductor layer A3 may include Zn-oxide-based material, for example, include Zn-oxide, In—Zn oxide, and Ga—In—Zn oxide. In an embodiment, the third semiconductor layer A3 may include In—Ga—Zn—O (IGZO), In—Sn—Zn—O (ITZO), or In—Ga—Sn—Zn—O (IGTZO) semiconductor containing metal such as indium (In), gallium (Ga), and stannum (Sn) in ZnO.

The third semiconductor layer A3 may include a channel region C3, a first region B3, and a second region D3 respectively arranged on two opposite sides of the channel region C3. One of the first region B3 and the second region D3 may correspond to a source region, and the other may correspond to a drain region.

The third transistor T3 may include a gate electrode (referred to as a third gate electrode GE3, hereinafter) overlapping the channel region C3 of the third semiconductor layer A3. The third gate electrode GE3 may have a double gate structure including a lower gate electrode G3A and an upper gate electrode G3B, wherein the lower gate electrode G3A is below the third semiconductor layer A3, and the upper gate electrode G3B is over the channel region C3.

The lower gate electrode G3A may be on the same layer (e.g., the first interlayer insulating layer 205) as a layer on which the upper electrode CE2 of the storage capacitor Cst is arranged. The lower gate electrode G3A may include the same material as a material of the upper electrode CE2 of the storage capacitor Cst.

The upper gate electrode G3B may be disposed over the third semiconductor layer A3 with a second gate insulating layer 209 therebetween. The second gate insulating layer 209 may include an inorganic insulating material such as silicon nitride, silicon oxynitride, and silicon oxide, and include a single-layered structure or a multi-layered structure including the above inorganic insulating materials.

A third interlayer insulating layer 210 may be disposed on the upper gate electrode G3B. The third interlayer insulating layer 210 may include an inorganic insulating material such as silicon oxynitride, and have a single layer or a multi-layer including the inorganic insulating materials.

Although it is shown in FIG. 8 that the upper electrode CE2 of the storage capacitor Cst is disposed on the same layer as the lower gate electrode G3A of the third gate electrode GE3, the embodiment is not limited thereto. In another embodiment, the upper electrode CE2 of the storage capacitor Cst may be arranged on the same layer as the third semiconductor layer A3, and may include the same material as that of the first region B3 and the second region D3 of the third semiconductor layer A3.

The first transistor T1 may be electrically connected to the third transistor T3 through the node connection line 166. The node connection line 166 may be disposed on the third interlayer insulating layer 210. One side of the node connection line 166 may be connected to the first gate electrode GE1 of the first transistor T1, and another side of the node connection line 166 may be connected to the first region B3 of the third semiconductor layer A3 of the third transistor T3.

The node connection line 166 may include aluminum (Al), copper (Cu), or titanium (Ti), and include a single layer or a multi-layer including the above materials. As an example, the node connection line 166 may have a triple-layered structure of titanium layer/aluminum layer/titanium layer.

A first source electrode (not shown) and a first drain electrode (not shown) of the first transistor T1 may be also disposed on the third interlayer insulating layer 210. That is, the first source electrode and the first drain electrode may include the same material on the substantially same layer as a layer on which the node connection line 166 is disposed. Specifically, the first source electrode and the first drain electrode may include aluminum (Al), copper (Cu), or titanium (Ti), and include a single layer or a multi-layer including the above materials.

A first organic insulating layer 211 may be disposed on the node connection line 166. The first organic insulating layer 211 may include an organic insulating material. The organic insulating material may include acryl, benzocyclobutene (BCB), polyimide, or hexamethyldisiloxane (HMDSO).

The data line DL and the driving voltage line PL may be disposed on the first organic insulating layer 211 and covered by a second organic insulating layer 213. The data line DL and the driving voltage line PL may include aluminum (Al), copper (Cu), or titanium (Ti), and include a single layer or a multi-layer including the above materials. As an example, the data line DL and the driving voltage line PL may each have a triple-layered structure of titanium layer/aluminum layer/titanium layer.

In addition, a connection electrode (not shown) may be disposed on the first organic insulating layer 211. The connection electrode may connect the pixel circuit PC and the light-emitting diode LED to each other. The connection line (not shown) and the data line DL may be disposed on the substantially same layer as a layer on which the driving voltage line PL is disposed and may include the same material. Specifically, the connection electrode (not shown) may include a conductive material including molybdenum (Mo), aluminum (Al), copper (Cu), and titanium (Ti) and have a single-layered structure or a multi-layered structure including the above materials.

The second organic insulating layer 213 may include acryl, BCB, polyimide, or HMDSO. Although it is shown in FIG. 8 that the data line DL and the driving voltage line PL are disposed on the first organic insulating layer 211, the embodiment is not limited thereto. In another embodiment, one of the data line DL and the driving voltage line PL may be disposed on the same layer (e.g., for example, the third interlayer insulating layer 210) as a layer on which the node connection line 166 is disposed.

In another embodiment, an additional organic insulating layer may be further disposed between the first organic insulating layer 211 and the second organic insulating layer 213. In this case, one of the data line DL and the driving voltage line PL may be disposed between the first organic insulating layer 211 and the additional organic insulating layer, and another of the data line DL and the driving voltage line PL may be disposed between the additional organic insulating layer and the second organic insulating layer 213.

A pixel electrode 221 of the light-emitting diode LED may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof. In another embodiment, the pixel electrode 221 may further include a conductive oxide material layer on or under the reflective layer. The conductive oxide material layer may include indium tin oxide (ITO), indium zinc oxide (IZO), zinc oxide (ZnO), indium oxide ($In_2O_3$), indium gallium oxide (IGO), or aluminum zinc oxide (AZO). In an embodiment, the pixel electrode 221 may have a triple-layered structure of ITO layer/Ag layer/ITO layer.

A bank layer 215 may be disposed on the pixel electrode 221. The bank layer 215 may include an opening that overlaps the pixel electrode 221 and cover the edges of the pixel electrode 221. The bank layer 215 may include an organic insulating material such as polyimide.

A spacer 217 may be formed on the bank layer 215. The spacer 217 may be formed together during the same process as a process of forming the bank layer 215, or formed separately during a separate process. In an embodiment, the spacer 217 may include an organic insulating material such as polyimide. Alternatively, the bank layer 215 may include an organic insulating material including a light-blocking dye, and the spacer 217 may include an organic insulating material such as polyimide.

An intermediate layer 222 includes an emission layer 222b. The intermediate layer 222 may include a first functional layer 222a or a second functional layer 222c, wherein the first functional layer 222a is under the emission layer 222b, and the second functional layer 222c is on the emission layer 222b. The emission layer 222b may include a polymer organic material or a low-molecular weight organic material configured to emit light having a preset color. In another embodiment, the emission layer 222b may include an inorganic material or quantum dots. The second functional layer 222c may include an electron transport layer (ETL) or an electron injection layer (EIL). The first functional layer 222a and the second functional layer 222c may each include an organic material.

An opposite electrode 223 may include a conductive material having a low work function. As an example, the opposite electrode 223 may include a (semi) transparent layer including silver (Ag), magnesium (Mg), aluminum (Al), platinum (Pt), palladium (Pd), gold (Au), nickel (Ni), neodymium (Nd), iridium (Ir), chrome (Cr), or an alloy thereof. Alternatively, the opposite electrode 223 may further include a layer on the (semi) transparent layer, the layer including ITO, IZO, ZnO, or $In_2O_3$.

The emission layer 222b may be formed to overlap the pixel electrode 221 through the opening of the bank layer 215. In contrast, an organic material layer, for example, the first functional layer 222a and the second functional layer 222c included in the intermediate layer, may cover the display area DA (see FIG. 5) entirely. The opposite electrode 223 may also cover the display area DA (see FIG. 5) entirely.

A capping layer 225 may be disposed on the opposite electrode 223. The capping layer 225 may include an inorganic material or an organic material. The capping layer 225 may include lithium fluoride (LiF), an inorganic insulating material or an organic insulating material. The capping layer 225 may cover the display area DA (see FIG. 5) entirely.

The light-emitting diode LED including the pixel electrode 221, the intermediate layer 222, and the opposite electrode 223 may be covered by an encapsulation layer 300. The encapsulation layer 300 may include at least one organic encapsulation layer and at least one inorganic encapsulation layer. In an embodiment, it is shown in FIG. 8 that the encapsulation layer 300 includes first and second inorganic encapsulation layers 310 and 330, and an organic encapsulation layer 320 therebetween. The encapsulation layer 300 may be disposed on the capping layer 225.

The first and second inorganic encapsulation layer 310 and 330 may include at least one inorganic material among aluminum oxide, titanium oxide, tantalum oxide, hafnium oxide, zinc oxide, silicon oxide, silicon nitride, silicon oxynitride, and the like. The first and second inorganic encapsulation layer 310 and 330 may include a single layer or a multi-layer including the above materials. The organic encapsulation layer 320 may include a polymer-based material. The polymer-based material may include an acryl-based resin, an epoxy-based resin, polyimide, and polyethylene. In an embodiment, the organic encapsulation layer 320 may include acrylate.

Figure 9:
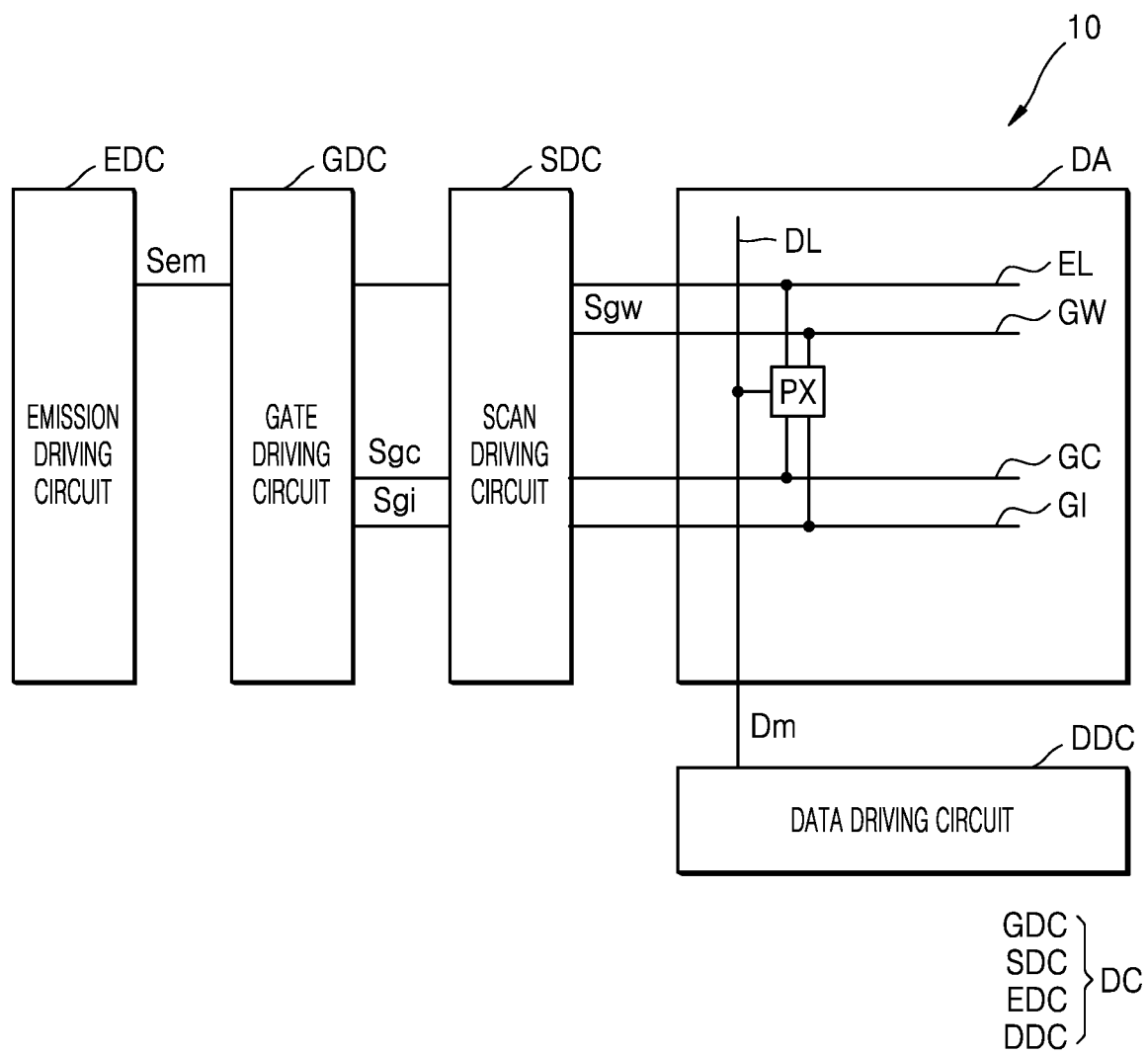
FIG. 9 is a schematic configuration view of a display apparatus according to an embodiment.

FIG. 9 is a schematic configuration view of the display apparatus 1 according to an embodiment.

Referring to FIG. 9, the plurality of pixels PX and signal lines may be located in the display area DA, wherein the signal lines may be configured to apply electrical signals to the plurality of pixels PX. The signal lines configured to apply electrical signals to each of the pixels PX may include the plurality of data lines DL, the plurality of emission control lines EL, the plurality of scan lines GW, the plurality of compensation gate lines GC, and the plurality of initialization gate lines GI.

The driving circuit DC may be located outside the display area DA, wherein the driving circuit DC is configured to supply signals for driving the pixels PX. The driving circuit DC may include a data driving circuit DDC, an emission driving circuit EDC, a gate driving circuit GDC, and a scan driving circuit SDC. The data driving circuit DDC may be arranged between the data driving circuit portion 2000 (see FIG. 5), that is, the first side display area SDA1 and the first terminal portion TD1. The data driving circuit DDC may be connected to the data lines DL and configured to output data signals Dm to the data lines DL.

The emission driving circuit EDC, the gate driving circuit GDC, and the scan driving circuit SDC may be arranged between the first driving circuit portion 1100 and the second driving circuit portion 1200. The emission driving circuit EDC may be connected to the emission control lines EL and configured to output emission control signals Sem to the emission control lines EL. The gate driving circuit GDC may be connected to the initialization gate lines GI and configured to output initialization signals Sgi to the initialization gate lines GI. In addition, the gate driving circuit may be connected to the compensation gate lines GC and configured to output compensation signals Sgc to the compensation gate lines GC. The scan driving circuit SDC may be connected to the scan lines GW and configured to output scan signals Sgw.

Figure 10:
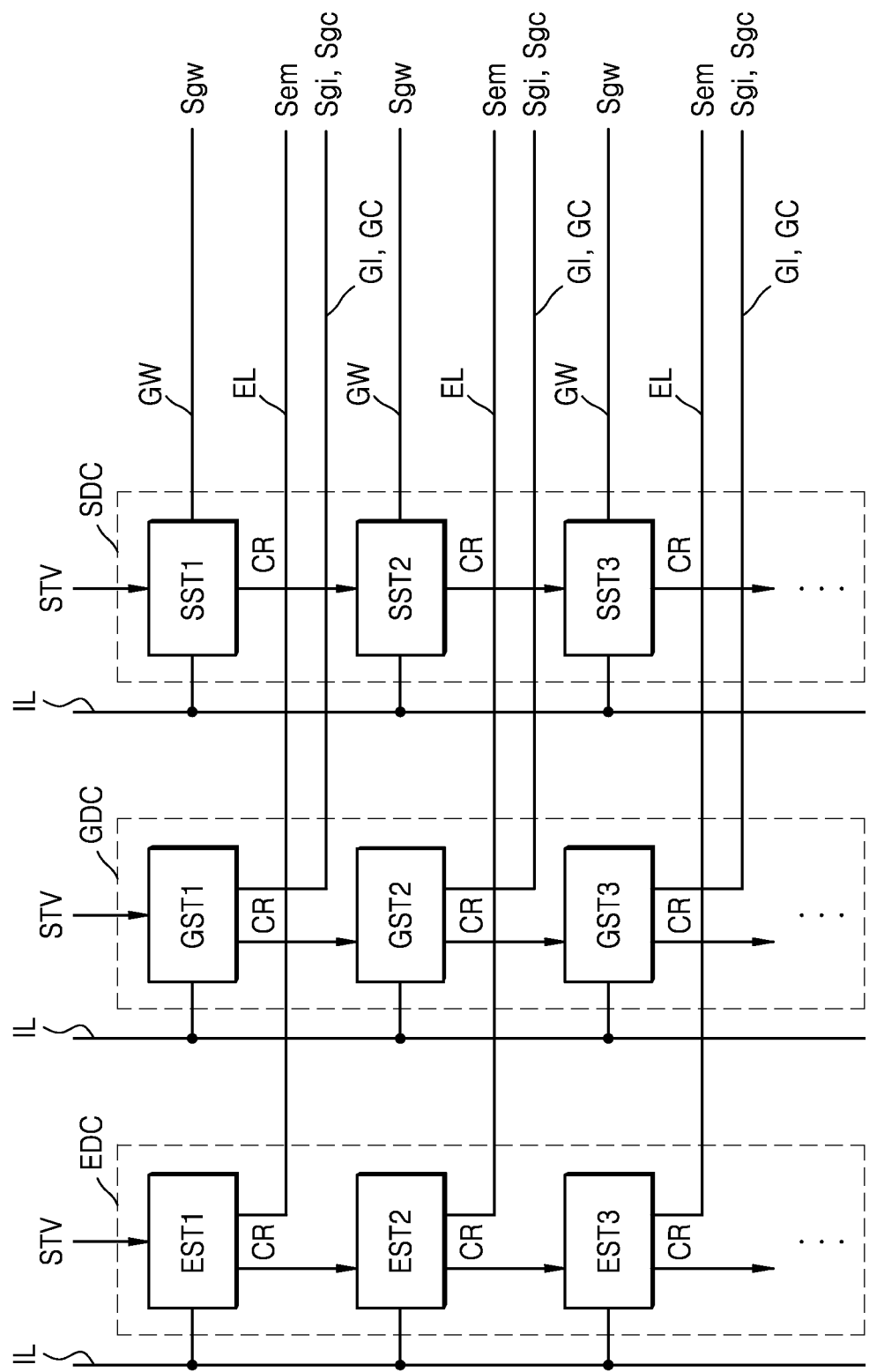
FIGS. 10 and 11 are schematic views of a driving circuit according to an embodiment.
Figure 11:
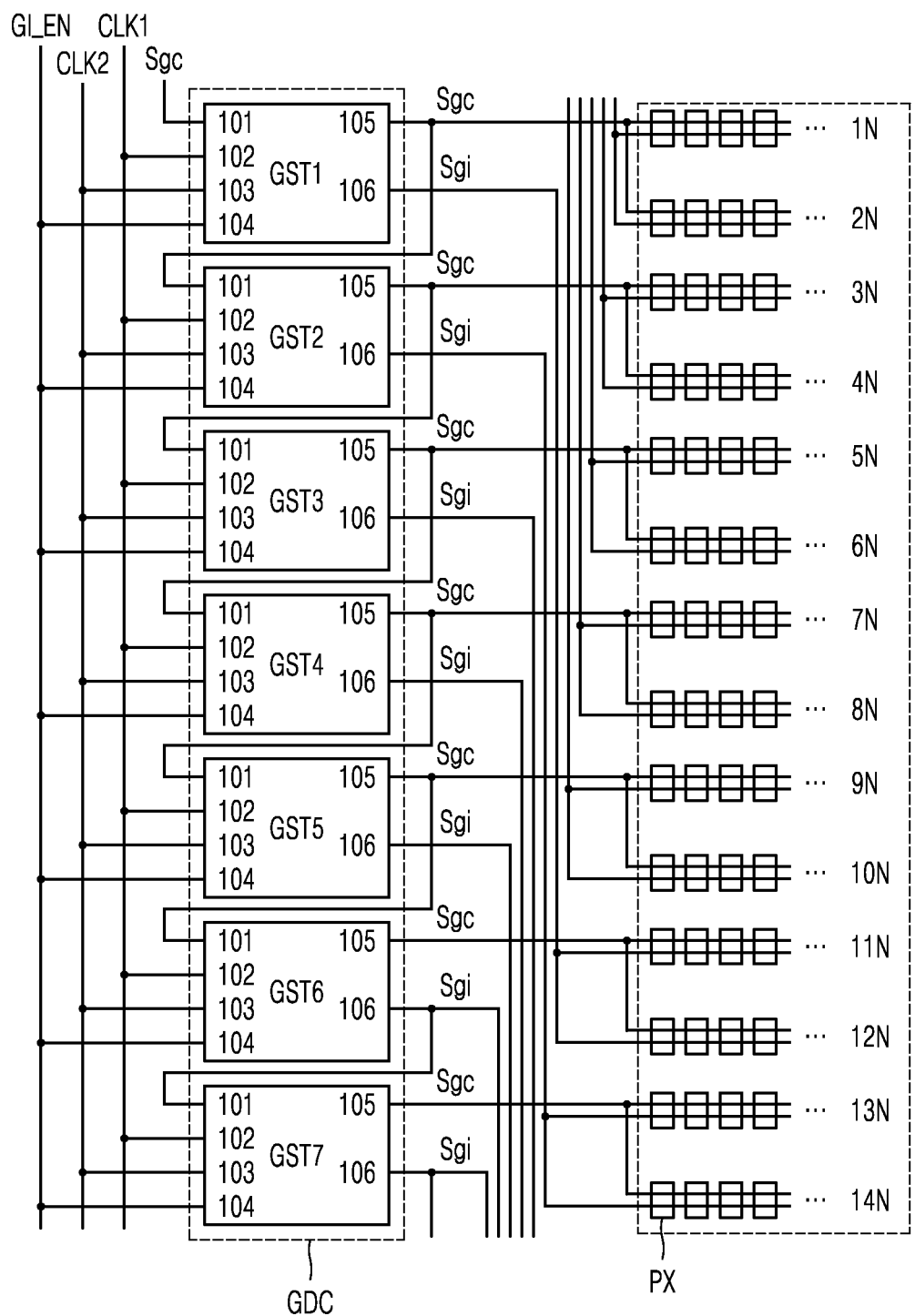

FIGS. 10 and 11 are schematic views of the driving circuit according to an embodiment. FIG. 10 is a schematic configuration view of the emission driving circuit EDC, the gate driving circuit GDC, and the scan driving circuit SDC, and FIG. 11 is a schematic configuration view of only the gate driving circuit GDC.

Referring to FIG. 10, the emission driving circuit EDC may be implemented as a shift register including a plurality of emission stages EST1, EST2, EST3, . . . . Each of emission stages EST1, EST2, EST3, . . . may be a sub-driving circuit. Each of emission stages EST1, EST2, EST3, . . . may be connected to a corresponding emission control line EL, a first emission stage EST1 that may be configured to output an emission control signal Sem to a corresponding emission control line EL may be configured to output an emission control signal Sem in response to an external start signal STV, and the rest of the emission stages EST2, EST3, . . . except for the first emission stage EST1 may each be configured to receive, as a start signal, a carry signal CR output from the previous stage. Each of emission stages EST1, EST2, EST3, . . . may be connected to a plurality of input lines IL arranged outside the emission stages EST1, EST2, EST3, . . . .

The gate driving circuit GDC may be implemented as a shift register including a plurality of gate stages GST1, GST2, GST3, . . . . Each of the plurality of gate stages GST1, GST2, GST3, . . . may be a sub-driving circuit. Each of the plurality of gate stages GST1, GST2, GST3, . . . may be connected to corresponding compensation gate line GC and the initialization gate line GI, configured to output a compensation signal Sgc to a corresponding compensation gate line GC, and configured to output an initialization signal Sgi to a corresponding initialization gate line GI. A first gate stage GST1 may be configured to output a gate signal GS in response to an external start signal STV. The rest of the stages GST2, GST3, . . . except for the first gate stage GST1 may each be configured to receive a carry signal CR as a start signal, the carry signal CR being output from the previous stage. Each of the plurality of gate stages GST1, GST2, GST3, . . . may be connected to the plurality of input lines IL arranged outside the plurality of gate stages GST1, GST2, GST3, . . . .

The scan driving circuit SDC may be implemented as a shift register including a plurality of scan stages SST1, SST2, SST3, . . . . Each of the scan driving stages may be a sub-driving circuit. Each of the scan stages SST1, SST2, SST3, . . . may be connected to a corresponding scan line GW and configured to output a scan signal Sgw to a corresponding scan line GW. A first scan stage SST1 may be configured to output a scan signal Sgw in response to an external start signal STV. The rest of the scan stages SST2, SST3, . . . except for the first scan stage SST1 may each be configured to receive a carry signal CR as a start signal, the carry signal CR being output from the previous stage. Each of the scan stages SST1, SST2, SST3, . . . may be connected to the plurality of input lines IL arranged outside the plurality of scan stages SST1, SST2, SST3, . . . .

The plurality of input lines IL may be signal lines including a plurality of voltage lines and a plurality of clock lines. For convenience of illustration, FIG. 10 shows only one input line.

Referring to FIG. 11, as described above, the gate driving circuit GDC may include a plurality of gate stages GST1, GST2, GST3, . . . . Each of the plurality of gate stages GST1, GST2, GST3, . . . may be connected to the compensation gate line GC and the initialization gate line GI to output a compensation signal Sgc and an initialization signal Sgi.

Specifically, each of the plurality of gate stages GST1, GST2, GST3, . . . may include a first input terminal 101, a second input terminal 102, a third input terminal 103, a fourth input terminal 104, a first output terminal 105, and a second output terminal 106.

The first input terminal 101 may be configured to receive a compensation signal Sgc and an initialization signal Sgi of the previous stage. Each of the second input terminal 102 and the third input terminal 103 may be configured to receive a first clock signal CLK1 and a second clock signal CLK2. Each of a first clock signal CLK1 and a second clock signal CLK2 may be a square wave signal that repeats a logic high level and a logic low level. The difference between a first clock signal CLK1 and a second clock signal CLK2 may be half a period or more. However, this is just an example, waveform relationship between a first clock signal CLK1 and a second clock signal CLK2 is not necessarily limited thereto. The fourth input terminal 104 may be configured to receive an initialization gate enable signal GI_EN. The first output terminal 105 may be configured to output a compensation signal Sgc, and the second output terminal 106 may be configured to output an initialization signal Sgi.

Each of the plurality of gate stages GST1, GST2, GST3, . . . may be configured to supply a compensation signal Sgc and an initialization signal Sgi to two adjacent rows of pixels PX. As an example, the first gate stage GST1 may be configured to supply a compensation signal Sgc to the pixels in a first row 1N and a second row 2N, and supply an initialization signal Sgi to the pixels in an eleventh row 11N and a 12-th row 12N. In other words, the pixels in a specific row may be supplied with an initialization signal Sgi from a stage arranged before a stage that is supplied with a compensation signal Sgc. This is because, as described above, a transistor including an oxide-based semiconductor material is employed as the fourth transistor T4 that receives an initialization signal Sgi, a signal transfer waveform may be extended compared to a transistor including a silicon-based semiconductor material is employed. That is, because a pixel circuit receives an initialization signal Sgi in advance from a stage prior to a stage supplied with a compensation signal Sgc, the pixel circuit may operate normally.

Figure 12:
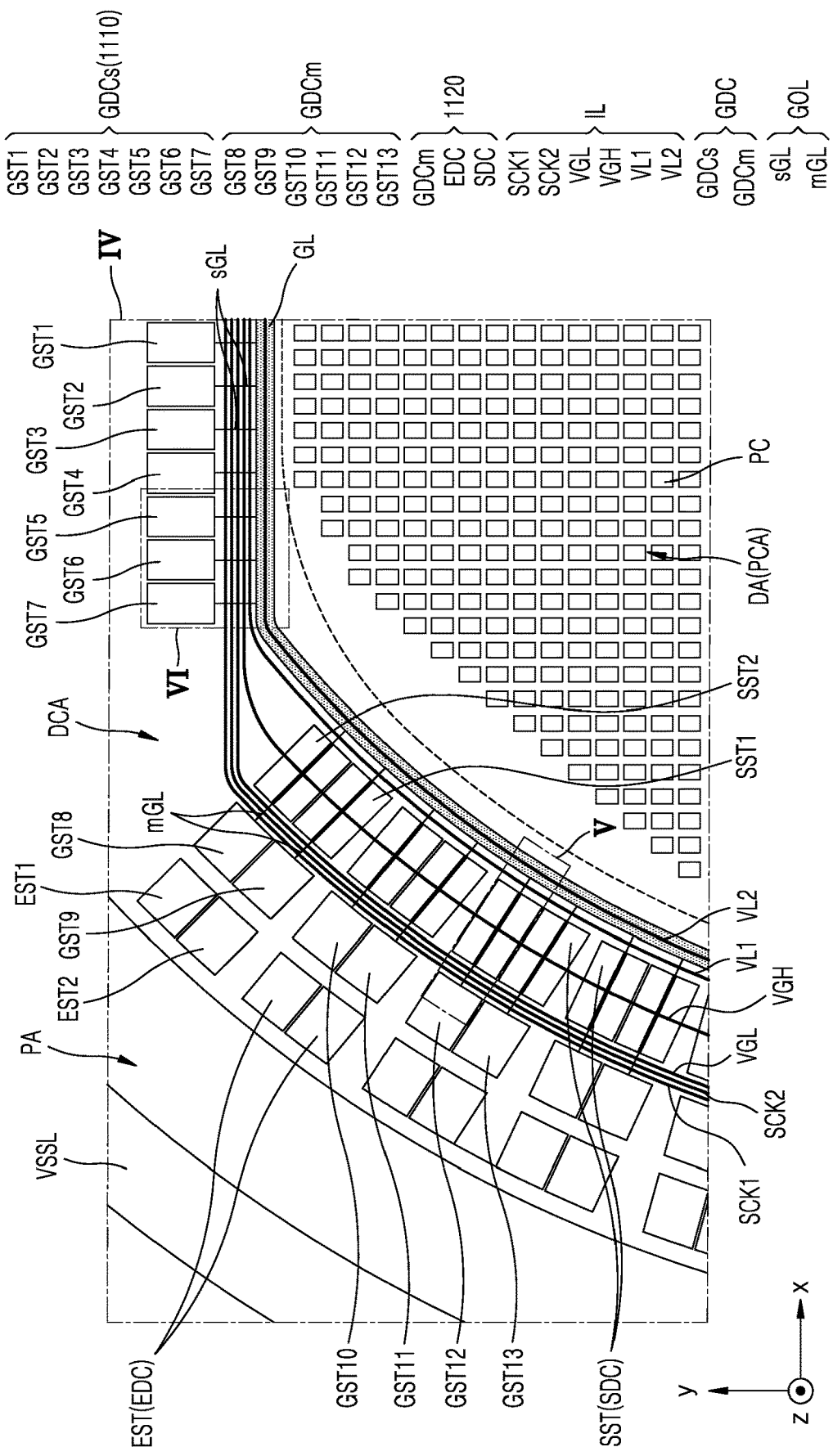
FIG. 12 is a schematic enlarged plan view of a portion of a display apparatus according to an embodiment and an enlarged view of a region IV of FIG. 5.

FIG. 12 is a schematic enlarged plan view of a portion of the display apparatus 1 according to an embodiment and an enlarged view of a region IV of FIG. 5.

Referring to FIG. 12, the pixel circuits PC may be arranged in the display area DA. Hereinafter, a region in which the pixel circuits PC are arranged is denoted by a pixel circuit area PCA. In the pixel circuit area PCA, the pixel circuits PC may be arranged to form rows and columns, and the pixel circuits PC adjacent to the round corner may have a stepwise configuration in a plan view. Although the pixel circuits PC may be respectively electrically connected to the light-emitting diodes LED (see FIG. 5) arranged in the display area DA as described with reference to FIG. 5, the light-emitting diodes are omitted in FIG. 12, for convenience of description.

A driving circuit area DCA may be arranged outside the pixel circuit area PCA on the substrate 100 (see FIG. 5). A plurality of driving circuits may be arranged in the driving circuit area DCA. However, as described with reference to FIG. 6A, some of the plurality of driving circuits may be arranged to overlap the light-emitting diode LED (see FIG. 5). That is, a portion of the driving circuit area DCA may be the display area DA, and the rest may be the peripheral area PA. The light-emitting diode LED (see FIG. 5) arranged in the driving circuit area DCA may be driven by being connected to the pixel circuit PC arranged in the pixel circuit area PCA through a connection line.

The driving circuit area DCA may include the first driving circuit portion 1100 and the second driving circuit portion 1200 (see FIG. 5), wherein the first driving circuit portion 1100 is arranged on the left with respect to a virtual line extending a y direction beyond the center of the front display area FDA (see FIG. 5), and the second driving circuit portion 1200 is arranged on the right. The first driving circuit portion 1100 may include the first main driving circuit portion 1120 and the first sub-driving circuit portion 1110, and the second driving circuit portion 1200 (see FIG. 5) may include the second main driving circuit portion 1220 (see FIG. 5) and the second sub-driving circuit portion 1210. As shown in FIG. 12, the first main driving circuit portion 1120 may be arranged to extend along the left side and the corner portion of the pixel circuit area PCA in a plan view, and the first sub-driving circuit portion 1110 may be arranged on the left upper portion of the pixel circuit area PCA in a plan view. Because the second driving circuit portion 1200 (see FIG. 5) may be arranged to be symmetrical to the first driving circuit portion 1100, the second main driving circuit portion 1220 (see FIG. 5) may be arranged to extend along the right side and the corner portion of the pixel circuit area PCA in a plan view, and the second sub-driving circuit portion 1210 (see FIG. 5) may be arranged on the right upper portion of the pixel circuit area PCA in a plan view.

The emission driving circuit EDC, the scan driving circuit SDC, and the gate driving circuit GDC may be arranged in the driving circuit area DCA. The gate driving circuit GDC may include a main gate driving circuit GDCm and a sub-gate driving circuit GDCs, wherein the main gate driving circuit GDCm is arranged in the first main driving circuit portion 1120 and the second main driving circuit portion 1220 (see FIG. 5), and the sub-gate driving circuit GDCs is arranged in the first sub-driving circuit portion 1110 and the second sub-driving circuit portion 1210 (see FIG. 5). That is, the first main driving circuit portion 1120 may include the emission driving circuit EDC, the scan driving circuit SDC, and the main gate driving circuit GDCm, and the first sub-driving circuit portion 1110 may include only the sub-gate driving circuit GDCs.

Specifically, the emission driving circuit EDC may include a plurality of emission stages EST, and all of the plurality of emission stages EST may be arranged in the first main driving circuit portion 1120 and the second main driving circuit portion 1220 (see FIG. 5). The scan driving circuit SDC may include a plurality of scan stages SST, and all of the plurality of scan stages SST may be arranged in the first main driving circuit portion 1120 and the second main driving circuit portion 1220 (see FIG. 5). In contrast, the gate driving circuit GDC may include the plurality of gate stages, most of the plurality of gate stages may be arranged in the first main driving circuit portion 1120 and the second main driving circuit portion 1220 (see FIG. 5), and some of the plurality of gate stages may be arranged in the sub-driving circuit portion 1110 and the second sub-driving circuit portion 1210 (see FIG. 5). Hereinafter, the plurality of gate stages may be arranged in the first main driving circuit portion 1120 and the second main driving circuit portion 1220 (see FIG. 5) are denoted by the main gate driving circuits GDCm, and the plurality of gate stages arranged in the sub-driving circuit portion 1110 and the second sub-driving circuit portion 1210 (see FIG. 5) are denoted by the sub-gate driving circuits GDCs.

The sub-gate driving circuits GDCs include a plurality of gate stages including the first gate stage GST1. In an embodiment, the sub-gate driving circuit GDCs may include first to seventh gate stages GST1, GST2, GST3, GST4, GST5, GST6, and GST7, and the other gate stages GST8, GST9, . . . may be included in the main gate driving circuit GDCm. In another embodiment, the sub-gate driving circuit GDCs may include first to fifth gate stages GST1, GST2, GST3, GST4, and GST5, and the other gate stages GST6, GST7, GST8, . . . may be included in the main gate driving circuit GDCm. As an example, the sub-gate driving circuit GDCs may include five or seven gate stages. However, while the main gate driving circuit GDCm may be configured to output both an initialization signal Sgi and the compensation signal Sgc, the sub-gate driving circuit GDCs may be configured to output only an initialization signal Sgi and not to output a compensation signal Sgc.

In other words, the emission stage EST, the gate stage GST, and the scan stage SST arranged in the same row in the first main driving circuit portion 1120 may be configured to output an emission control signal Sem (see FIG. 10), a scan signal Sgw, a compensation signal Sgc to the pixels in the same row, but output an initialization signal Sgi to the pixels in another row. As an example, the first emission stage EST1, the eighth gate stage GST8, and the first scan stage SST1 may be arranged adjacent to each other in a first row of the first main driving circuit portion 1120, and the first emission stage EST1, the eighth gate stage GST8, and the first scan stage SST1 may be configured to output an emission control signal Sem (see FIG. 10), a scan signal Sgw (see FIG. 10), a compensation signal Sgc (see FIG. 10), but output an initialization signal Sgi (see FIG. 10) to the pixels in the 15-th row and 16-th row. As described above with reference to FIG. 11, this is to ensure that the pixels in a particular row receive an initialization signal Sgi in advance from the 5-th to 7-th preceding stages before the stage that receives a compensation signal Sgc (see FIG. 9).

In addition, each of the plurality of stages may be connected to signal lines configured to transfer an output signal to the pixel circuit PC. As an example, the emission stage EST may be connected to the emission control line EM (not shown) configured to transfer an emission control signal Sem (see FIG. 9) to the pixel circuit PC, and the scan stage SST may be connected to the scan line GW (not shown) configured to transfer a scan signal Sgw to the pixel circuit PC. The gate stage GST may be electrically connected to the compensation gate line GC (not shown) configured to transfer a compensation signal Sgc (see FIG. 9) to the pixel circuit PC, and the initialization gate line GI (not shown) configured to transfer an initialization signal Sgi (see FIG. 9).

In this case, the gate stage GST may be electrically connected to the initialization gate line GI (not shown) and the compensation gate line GC (not shown) through a gate signal output line GOL and a gate signal connection line GL. The gate signal output line GOL may be configured to primarily transfer a signal output from the gate stage GST to the gate signal connection line GL, and the gate signal connection line GL may be configured to transfer a signal received through the gate signal output line GOL to the initialization gate line GI (not shown) or the compensation gate line GC (not shown). Specifically, the sub-gate driving circuit GDCs may be configured to transfer an initialization signal Sgi (see FIG. 9) to the initialization gate line GI (not shown) through a sub-gate signal output line sGL and the gate signal connection line GL, and the initialization gate line GI (not shown) may be configured to transfer the relevant signal to the pixel circuit PC. Likewise, the main gate driving circuit GDCm may be configured to transfer an initialization signal Sgi (see FIG. 9) or a compensation signal Sgc (see FIG. 9) to the initialization gate line GI (not shown) or the compensation gate line GC (not shown) through a main gate signal output line mGL and the gate signal connection line GL.

Accordingly, the sub-gate signal output line sGL may be arranged between the sub-gate driving circuit GDCs and the pixel circuit area PCA and may extend in the second direction (the y direction). The main gate signal output line mGL may be arranged between the main gate driving circuit GDCm and the pixel circuit area PCA and may extend in a direction in which the emission stage EST, the gate stage GST, and the scan stage SST of a row including the gate stage GST connected thereto are listed. The gate signal connection line GL connected to the sub-gate driving circuit GDCs may extend in a direction crossing the sub-gate signal output line sGL and extend along the corner portion of the pixel circuit area PCA. The gate signal connection line GL connected to the main gate driving circuit GDCm may extend in a direction crossing the main gate signal output line mGL and extend along the corner portion of the pixel circuit area PCA.

In addition, a plurality of input lines IL may be arranged in the driving circuit area DCA. In an embodiment, as shown in FIG. 12, the plurality of input lines IL may include scan clock lines SCK1 and SCK2, gate voltage lines VGH and VGL, and the initialization voltage lines VL1 and VL2. The scan clock lines SCK1 and SCK2 are wirings configured to apply a clock signal to the scan driving circuit SDC and may include a first scan clock line SCK1 and a second scan clock line SCK2, wherein the first scan clock line SCK1 applies a first clock signal, and the second scan clock line SCK2 applies a second clock signal. The gate voltage lines VGH and VGL are wirings configured to apply the driving voltage to the scan driving circuit SDC and may include a gate-high voltage line VGH to which a gate-off voltage is applied, and a gate-low voltage line VGL to which a gate-on voltage is applied. The initialization voltage lines VL1 and VL2 may include the first initialization voltage line VL1 and the second initialization voltage line VL2, wherein the first initialization voltage line VL1 is configured to transfer a first initialization voltage Vint, and the second initialization voltage line VL2 is configured to transfer a second initialization voltage Vaint. Accordingly, the first scan clock line SCK1 and the second scan clock line SCK2 may be arranged between the gate driving circuit GDC and the scan driving circuit SDC, and the gate voltage lines VGH and VGL may be arranged to be adjacent to or overlap the scan driving circuit SDC, and the initialization voltage lines VL1 and VL2 may be arranged between the scan driving circuit SDC and the pixel circuit area PCA.

The plurality of input lines IL may extend in a direction crossing the gate signal output line GOL. Accordingly, because the plurality of input lines IL partially overlap each of the sub-gate signal output line sGL and the main gate signal output line mGL, a parasitic capacitance may be formed in the sub-gate signal output line sGL and the main gate signal output line mGL due to the overlapping structure of the plurality of input lines IL. The structures of the plurality of input lines IL and the gate signal input line GOL are described below in detail with reference to FIGS. 13 to 16.

Figure 13:
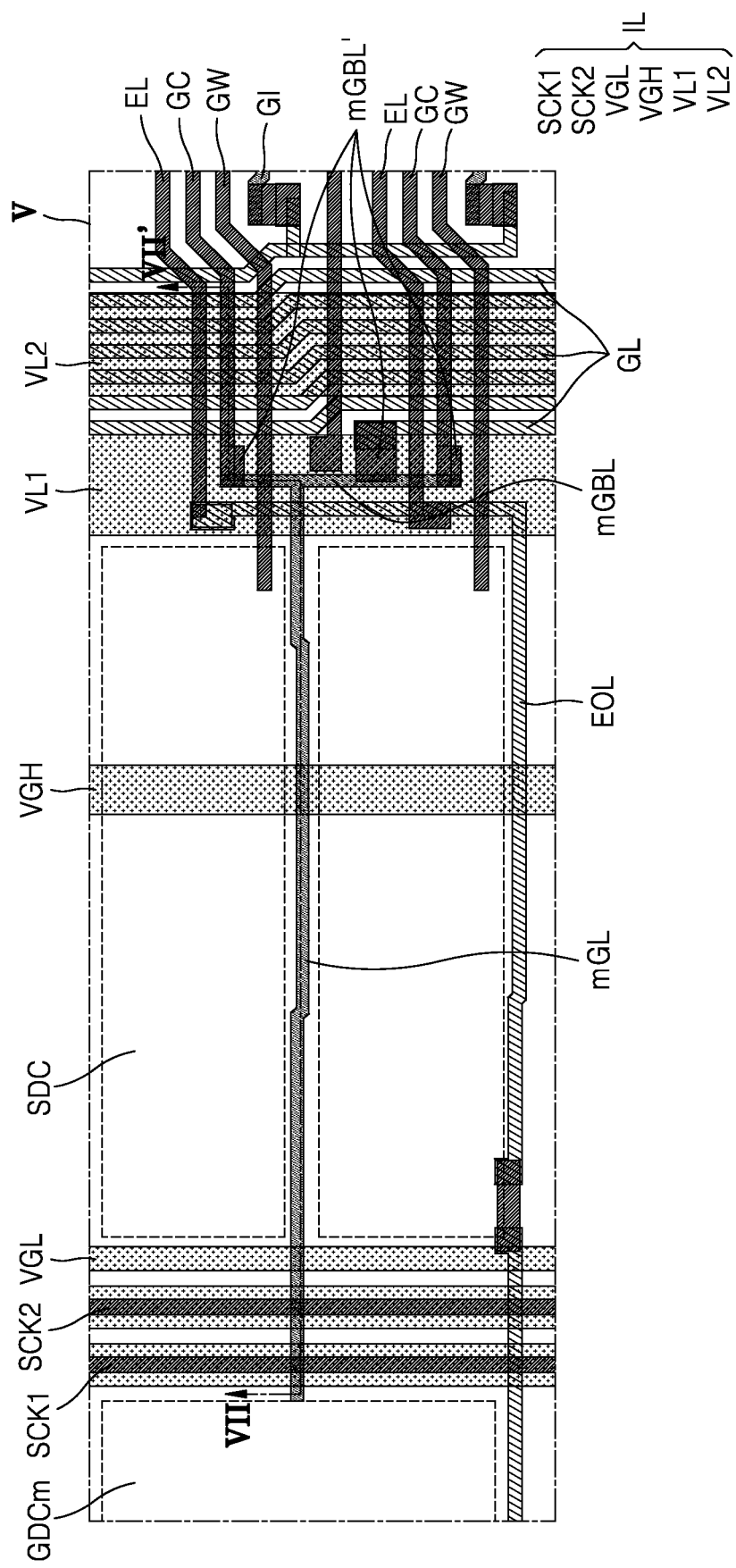
FIG. 13 is a schematic enlarged plan view of a portion of a display apparatus according to an embodiment and an enlarged view of a region V of FIG. 12.
Figure 14:
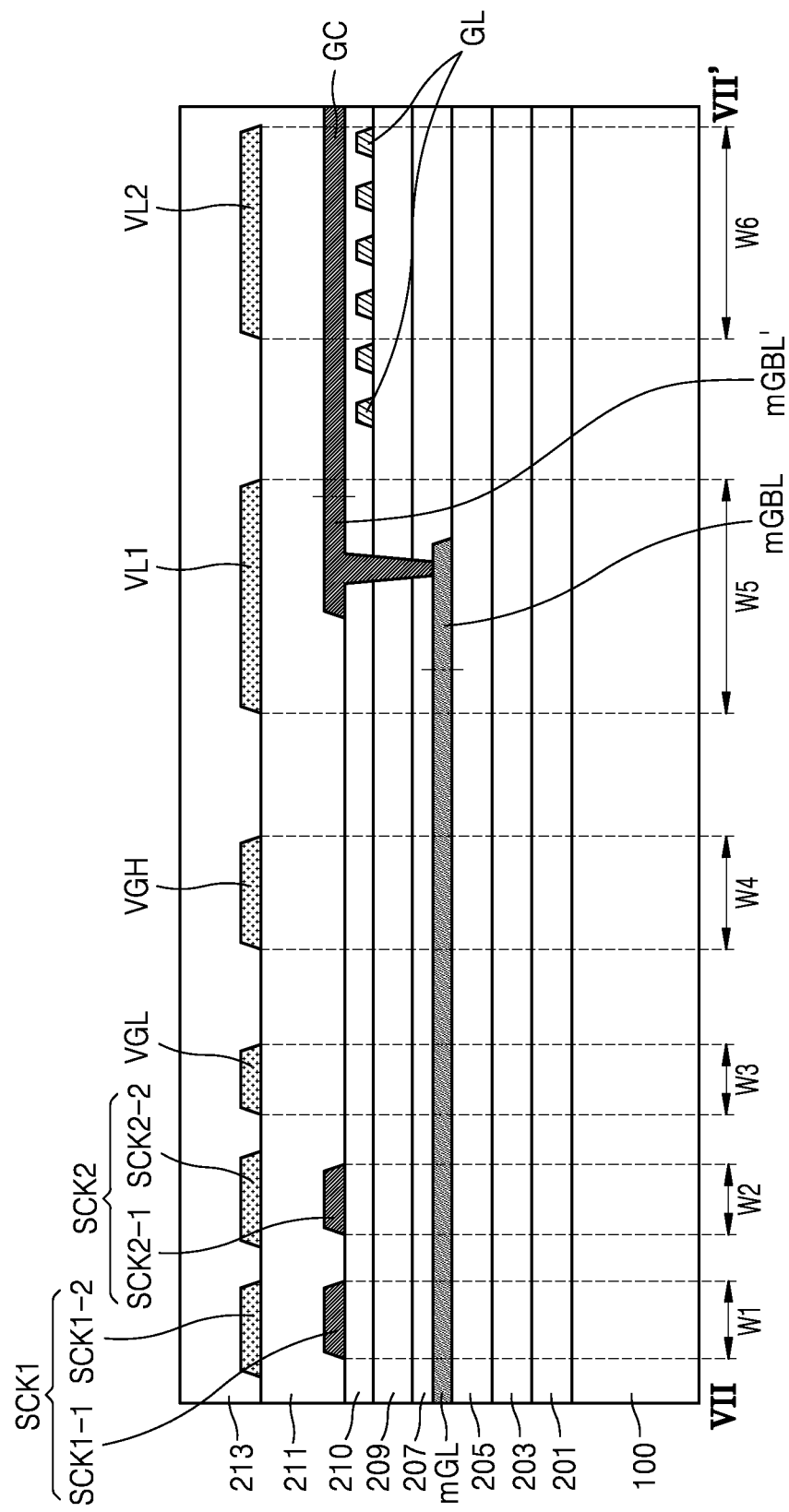
FIG. 14 is a schematic cross-sectional view of a portion of the display apparatus, taken along line VII-VII' of FIG. 13, according to an embodiment.
Figure 15:
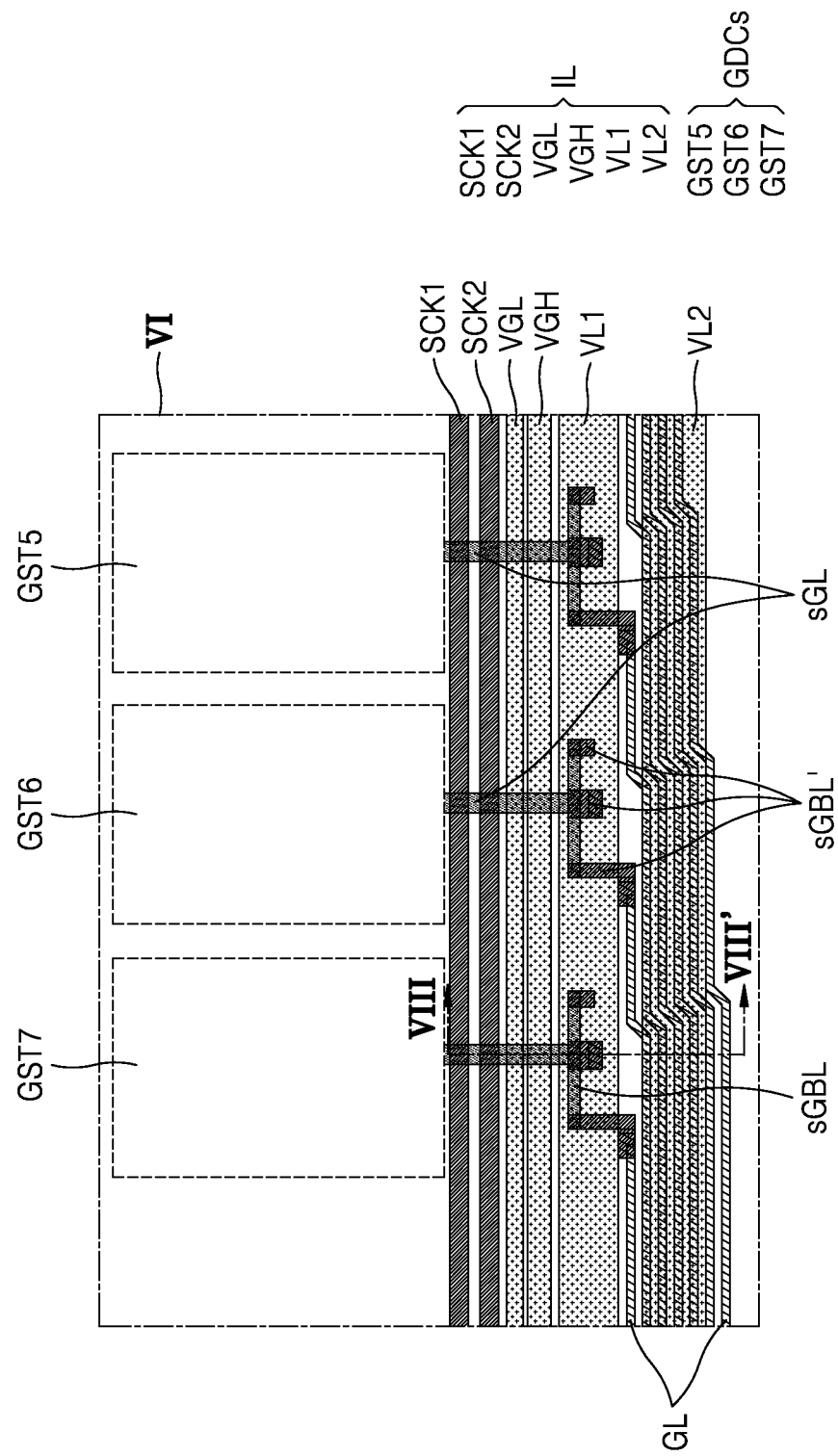
FIG. 15 is a schematic enlarged plan view of a portion of a display apparatus according to an embodiment and an enlarged view of a region VI of FIG. 12.
Figure 16:
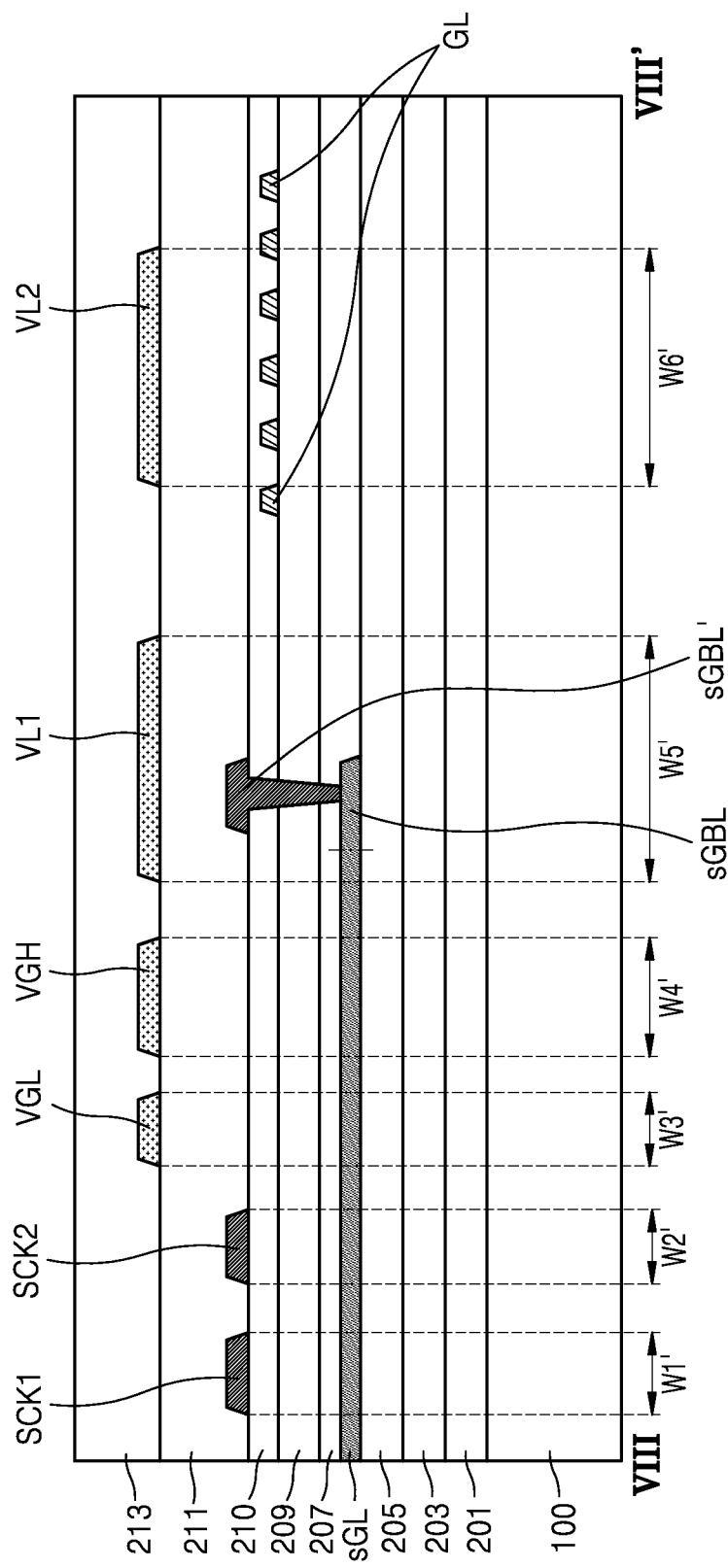
FIG. 16 is a schematic cross-sectional view of a portion of the display apparatus, taken along line VIII-VIII' of FIG. 15, according to an embodiment.

FIG. 13 is the schematic enlarged plan view of a portion of a display apparatus according to an embodiment and an enlarged view of a region V of FIG. 12. FIG. 14 is a schematic cross-sectional view of a portion of the display apparatus, taken along line VII-VII' of FIG. 13, according to an embodiment. FIG. 15 is a schematic enlarged plan view of a portion of the display apparatus according to an embodiment and an enlarged view of a region VI of FIG. 12. FIG. 16 is a schematic cross-sectional view of a portion of the display apparatus, taken along line VIII-VIII' of FIG. 15, according to an embodiment. FIGS. 13 and 14 are schematic views of a portion of the first main driving circuit portion 1120 (see FIG. 12), and FIGS. 15 and 16 are schematic views of a portion of the first sub-driving circuit portion 1110 (see FIG. 12).

First, referring to FIGS. 13 and 14, the main gate driving circuit GDCm, the scan driving circuit SDC, and the plurality of input lines IL may be arranged in the main driving circuit portion 1120 (see FIG. 12).

As described above, a compensation signal Sgc (see FIG. 9) output from the main gate driving circuit GDCm may be transferred to the pixel circuit through the compensation gate line GC, and an initialization signal Sgi (see FIG. 9) output from the main gate driving circuit GDCm may be transferred to the pixel circuit through the initialization gate line GI. In this case, to transfer a signal output from the main gate driving circuit GDCm to the compensation gate line GC and the initialization gate line GI, the main gate signal output line mGL and the gate signal connection line GL may be arranged. Additionally, in order to transmit the signal output from the emission driving circuit EDC (see FIG. 12) to the emission control line EL (see FIG. 9), a light emitting signal output wiring EOL connecting the emission driving circuit EDC (see FIG. 12) and the emission control line EL (see FIG. 9) may be disposed.

Specifically, a compensation signal Sgc (see FIG. 9) output from the main gate driving circuit GDCm may be transferred to the compensation gate line GC through the main gate signal output line mGL. In this case, because one gate stage GST (see FIG. 9) may be configured to transfer a compensation signal Sgc (see FIG. 9) to the pixels in two rows, the main gate signal output line mGL may be connected to two compensation gate lines GC. The main gate signal output line mGL may include a main bridge line mGBL to be connected to two compensation gate lines GC. The main bridge line mGBL may extend in a direction perpendicular to the main gate signal output line mGL to be divided into two branches. In addition, the main gate signal output line mGL may include contact regions mGBL' to be connected to the compensation gate line GC.

Likewise, an initialization signal Sgi (see FIG. 9) output from the main gate driving circuit GDCm may be transferred to the initialization gate line GI through the main gate signal output line mGL and the gate signal connection line GL. As described above, in the case where an oxide semiconductor layer is applied to the fourth transistor T4, because fifth to seventh previous stages should receive an initialization signal Sgi (see FIG. 9), a distance between the main gate driving circuit GDCm configured to output a signal and the pixel circuit configured to receive a signal increases. Accordingly, not only the main gate signal output line mGL but also the gate signal connection line GL may be additionally arranged. In addition, to connect the main gate signal output line mGL and the gate signal connection line GL to each other, the main bridge line mGBL and a contact region mGBL' may be arranged.

Referring to FIG. 14, the main gate signal output line mGL may be disposed between the first interlayer insulating layer 205 and the second interlayer insulating layer 207. That is, the main gate signal output line mGL may be disposed on the substantially same layer as a layer on which the upper electrode CE2 (see FIG. 8) of the storage capacitor Cst (see FIG. 8) and the lower gate electrode G3A (see FIG. 8) of the third transistor T3 (see FIG. 8) are disposed, and may include the same material as a material of the lower gate electrode G3A (see FIG. 8).

The compensation gate line GC may be disposed between the third interlayer insulating layer 210 and the first organic insulating layer 211, disposed on the substantially same layer as a layer on which the node connection line 166 (see FIG. 8) and the first source electrode (not shown) are disposed, and may include the same material as a material of the node connection line 166 and the first source electrode.

The main bridge line mGBL may be disposed on the substantially same layer as a layer on which the main gate signal output line mGL is disposed, and the contact region mGBL' may be disposed on the substantially same layer as a layer on which the compensation gate line GC is disposed. Accordingly, the main bridge line mGBL may be disposed on the substantially same layer as a layer on which the lower gate electrode G3A of the third transistor T3 (see FIG. 8) is disposed, the contact region mGBL' connected to the compensation gate line GC may be disposed on the substantially same layer as a layer on which the node connection line 166 is disposed, and the main bridge line mGBL and the compensation gate line GC may be connected to each other through a contact hole of the contact region mGBL'.

In addition, the gate signal connection line GL may be disposed between the second gate insulating layer 209 and the third interlayer insulating layer 210. The gate signal connection line GL may be disposed on the substantially same layer as a layer on which the upper gate electrode G3B is disposed and may include the same material as a material of the upper gate electrode G3B. Because the contact region mGBL may be disposed on the substantially same layer as a layer on which the node connection line 166 (see FIG. 8) is disposed, the main bridge line mGBL and the contact region mGBL may be connected to each other through a contact hole. Because the contact region mGBL and the gate signal connection line GL are connected to each other through another contact hole, the main gate signal output line mGL and the gate signal connection line GL may be electrically connected to each other.

Referring to FIGS. 13 and 14, the main gate driving circuit GDCm may be arranged outside the scan driving circuit SDC, and the first scan clock line SCK1, the second scan clock line SCK2, the gate low voltage line VGL may be arranged between the main gate driving circuit GDCm and the scan driving circuit SDC. The gate high voltage line VGH may be arranged to overlap the scan driving circuit SDC, and the first initialization voltage line VL1 and the second initialization voltage line VL2 may be arranged between the scan driving circuit SDC and the pixel circuit area PCA (see FIG. 12). In this case, the plurality of input lines IL may extend in a direction crossing a direction in which the main gate signal output line mGL extends.

Referring to FIG. 14, the first scan clock line SCK1 and the second scan clock line SCK2 may each have a double wiring structure. As an example, the first scan clock line SCK1 may include a first lower scan clock line SCK1-1 and a first upper scan clock line SCK1-2, and the second scan clock line SCK2 may include a second lower scan clock line SCK2-1 and a second upper scan clock line SCK2-2. In this case, the first lower scan clock line SCK1-1 and the second lower scan clock line SCK2-1 may be disposed between the third interlayer insulating layer 210 and the first organic insulating layer 211, disposed on the substantially same layer as a layer on which the node connection line 166 (see FIG. 8) and the first source electrode (not shown) are disposed, and may include the same material as a material of the node connection line 166 (see FIG. 8). The first upper scan clock line SCK1-2 and the second upper scan clock line SCK2-2 may be disposed between the first organic insulating layer 211 and the second organic insulating layer 213, disposed on the substantially same layer as a layer on which the driving voltage line PL (see FIG. 8) and the connection electrode (not shown) are disposed, and may include the same material as a material of the driving voltage line PL.

The gate low voltage line VGL, the gate high voltage line VGH, the first initialization voltage line VL1, and the second initialization voltage line VL2 may be disposed on the substantially same layer as a layer on which the first upper scan clock line SCK1-2 and the second upper scan clock line SCK2-2 are disposed, and may include the same material as a material of the first upper scan clock line SCK1-2 and the second upper scan clock line SCK2-2. Specifically, the gate low voltage line VGL, the gate high voltage line VGH, the first initialization voltage line VL1, and the second initialization voltage line VL2 may be disposed between the first organic insulating layer 211 and the second organic insulating layer 213, disposed on the substantially same layer as a layer on which the driving voltage line PL (see FIG. 8) and the connection electrode (not shown) are disposed, and may include the same material as a material of the driving voltage line PL.

Due to this structure, the main gate signal output line mGL and the gate signal connection line GL may include a partial region overlapping the plurality of input lines IL. Specifically, because the main gate signal output line mGL overlaps the first scan clock line SCK1 and the second scan clock line SCK2, a parasitic capacitance may be formed due to the first and second scan clock lines SCK1 and SCK2. However, because the first and second scan clock lines SCK1 and SCK2 each have a double wiring structure, and the main gate signal output line mGL is closer to the lower lines than the upper lines, a parasitic capacitance may be more influenced by the first and second lower scan clock lines SCK1-1 and SCK2-1 than the first and second upper scan clock lines SCK1-2 and SCK2-2. That is, a parasitic capacitance may be formed on the main gate signal output line mGL, wherein the parasitic capacitance is due to the first lower scan clock line SCK1-1 of a first width W1 and the second lower scan clock line SCK2-1 of a second width W2.

In addition, because the main gate signal output line mGL overlaps the gate low voltage line VGL and the gate high voltage line VGH, a parasitic capacitance due to the gate low voltage line VGL of a third width W3 and the gate high voltage line VGH of a fourth width W4 may be formed.

Likewise, because the first initialization voltage line VL1 overlaps the main gate signal output line mGL, a parasitic capacitance may be formed also by the first initialization voltage line VL1 having a fifth width W5. Particularly, because the first initialization voltage line VL1 overlaps the main bridge line mGBL and the contact region mGBL', a parasitic capacitance due to the relevant overlapping region may occur. Although the second initialization voltage line VL2 does not overlap the main gate signal output line mGL but overlaps the gate signal connection line GL, a parasitic capacitance may be added to a line configured to transfer an initialization signal Sgi (see FIG. 9) also by the second initialization voltage line VL2 having a sixth width W6.

Consequently, a parasitic capacitance due to the first and second scan clock lines SCK1 and SCK2, the gate low and high voltage lines VGL and VGH, and the first and second initialization voltage lines VL1 and VL2 may be formed in the main gate signal output line mGL and the gate signal connection line GL configured to transfer an initialization signal Sgi (see FIG. 9) output by the main gate driving circuit GDCm.

Next, referring to FIGS. 15 and 16, the sub-gate driving circuit GDCs and the plurality of input lines IL may be arranged in the first sub-gate driving circuit portion 1110 (see FIG. 12).

Only an initialization signal Sgi (see FIG. 9) may be output by the sub-gate driving circuit GDCs and transferred to the pixel circuit through the initialization gate line GI (see FIG. 13). In this case, to transfer a signal output from the sub-gate driving circuit GDCs to the initialization gate line GI (see FIG. 13), the sub-gate signal output line sGL and the gate signal connection line GL may be arranged. In addition, to connect the sub-gate signal output line sGL and the gate signal connection line GL to each other, a sub-bridge line sGBL and a contact region sGBL' may be arranged.

Like the main gate signal output line mGL (see FIG. 14), the sub-gate signal output line sGL may be disposed between the first interlayer insulating layer 205 and the second interlayer insulating layer 207. That is, the sub-gate signal output line sGL may be disposed on the substantially same layer as a layer on which the lower gate electrode G3A (see FIG. 8) of the third transistor T3 (see FIG. 8) is disposed, and may include the same material as a material of the lower gate electrode G3A (see FIG. 8). Because the sub-bridge line sGBL extends from the sub-gate signal output line sGL, the sub-bridge line sGBL may be disposed on the substantially same layer as a layer on which the sub-gate signal output line sGL is disposed.

In addition, the gate signal connection line GL configured to transfer a signal output from the sub-gate driving circuit GDCs may be disposed on the substantially same layer as a layer on which the gate signal connection line GL configured to transfer a signal output from the main gate driving circuit GDCm, and may include the same material as a material of the gate signal connection line GL configured to transfer a signal output from the main gate driving circuit GDCm. That is, the gate signal connection line GL connected to the sub-gate driving circuit GDCs is also disposed between the second gate insulating layer 209 and the third interlayer insulating layer 210, and disposed on the substantially same layer as a layer on which the upper gate electrode G3B (see FIG. 8) of the third transistor T3 (see FIG. 8) is disposed, and may include the same material as a material of the upper gate electrode G3B.

Because only the sub-gate driving circuit GDCs is arranged in the first sub-driving circuit portion 1110, the plurality of input lines IL may be arranged between the sub-gate driving circuit GDCs and the pixel circuit area PCA (see FIG. 12). However, although the scan driving circuit SDC (see FIG. 13) is not arranged in the first sub-driving circuit portion 1110, the plurality of input lines IL crossing the main gate signal output line mGL may extend to cross the sub-gate signal output line sGL. This is for equally forming a parasitic capacitance in the sub-gate signal output line sGL, wherein the parasitic capacitance is formed in the main gate signal output line mGL due to the plurality of input lines IL. That is, the first scan clock line SCK1, the second scan clock line SCK2, the gate low voltage line VGL, the gate high voltage line VGH, the first initialization voltage line VL1, and the second initialization voltage line VL2 may extend to the upper portion along the corner portion of the pixel circuit area PCA (see FIG. 12) and be arranged to overlap the sub-gate signal output line sGL or the gate signal connection line GL.

Referring to FIG. 16, the plurality of input lines IL arranged between the sub-gate driving circuit GDCs and the pixel circuit area PCA (see FIG. 12) may be formed on the substantially same layer as a layer on which the plurality of input lines IL arranged between the main gate driving circuit GDCm and the pixel circuit area PCA (see FIG. 12) are disposed. This is for reducing a deviation between parasitic capacitances respectively formed in the main gate signal output line mGL and the sub-gate signal output line sGL.

Specifically, the gate low voltage line VGL, the gate high voltage line VGH, the first initialization voltage line VL1, and the second initialization voltage line VL2 arranged in the sub-gate driving circuit GDCs may be disposed on the substantially same layer as a layer on which the input lines IL arranged in the main gate driving circuit GDCm are disposed, and may include the same material as a material of the input lines IL. That is, the gate low voltage line VGL, the gate high voltage line VGH, the first initialization voltage line VL1, and the second initialization voltage line VL2 arranged in the sub-gate driving circuit GDCs may be disposed between the first organic insulating layer 211 and the second organic insulating layer 213, disposed on the substantially same layer as a layer on which the driving voltage line PL (see FIG. 8) and the connection electrode (not shown) are disposed, and may include the same material as a material of the driving voltage line PL.

In addition, the first scan clock line SCK1 and the second scan clock line SCK2 arranged in the sub-gate driving circuit GDCs may be also disposed on the substantially same layer as a layer on which the first scan clock line SCK1 and the second scan clock line SCK2 arranged in the main gate driving circuit GDCm are disposed. However, although the first scan clock line SCK1 and the second scan clock line SCK2 arranged in the main gate driving circuit GDCm have a double wiring structure, but the wirings that contribute much in substantially forming the parasitic capacitance are the first and second lower scan clock lines SCK1-1 and SCK2-1. Accordingly, the first scan clock line SCK1 and the second scan clock line SCK2 arranged in the sub-gate driving circuit GDCs may be disposed on the substantially same layer as a layer on which the first and second lower scan clock lines SCK1-1 and SCK2-1 are disposed. That is, the first scan clock line SCK1 and the second scan clock line SCK2 arranged in the sub-gate driving circuit GDCs may be disposed between the third interlayer insulating layer 210 and the first organic insulating layer 211, disposed on the substantially same layer as a layer on which the node connection line 166 (see FIG. 8) and the first source electrode (not shown) are disposed, and may include the same material as a material of the node connection line 166 (see FIG. 8).

To reduce a deviation between a parasitic capacitance formed in the wiring configured to transfer an initialization signal Sgi (see FIG. 9) output from the sub-gate driving circuit GDCs and a parasitic capacitance formed in the wiring configured to transfer an initialization signal Sgi (see FIG. 9) output from the main gate driving circuit GDCm, thicknesses of the plurality of input lines IL crossing each wiring may be adjusted to be equal to each other. That is, the plurality of input lines IL may be formed such that an area in which the sub-gate signal output line sGL and the plurality of input lines IL crossing the sub-gate signal output line sGL overlap each other is equal to an area in which the main gate signal output line mGL and the plurality of input lines IL crossing the main gate signal output line mGL overlap each other.

Accordingly, the first scan clock line SCK1 arranged in the sub-gate driving circuit GDCs may have a first width W1', which is equal to the first width W1 (see FIG. 14) of the first lower scan clock line SCK1-1 of the main gate driving circuit GDCm. Likewise, the second scan clock line SCK2 may have a second width W2', which is equal to the second width W2 (see FIG. 14), the gate low voltage line VGL may have a third width W3', which is the third width W3 (see FIG. 14), and the gate high voltage line VGH may have a fourth width W4', which is the fourth width W4 (see FIG. 14). Because the first initialization voltage line VL1 and the second initialization voltage line VL2 may also overlap not only the sub-gate signal output line sGL but also the gate signal connection line GL, the first initialization voltage line VL1 may have a fifth width W5', which is equal to the fifth width W5 (see FIG. 14), and the second initialization voltage line VL2 may have a sixth width W6', which is equal to the sixth width W6 (see FIG. 14).

To further reduce a deviation in the parasitic capacitance, the sub-gate signal output line sGL may include the sub-bridge line sGBL and the contact regions sGBL'. That is, because the wiring configured to transfer an initialization signal Sgi (see FIG. 9) output from the main gate driving circuit GDCm includes the main bridge line mGBL and the plurality of contact regions mGBL', and the relevant regions overlap the first initialization voltage line VL1 to add a parasitic capacitance, the sub-bridge line sGBL and the contact regions sGBL' may be formed in also the sub-gate driving circuit GDCs to equally add a parasitic capacitance. Accordingly, the sub-bridge line sGBL and the contact region sGBL may be disposed on the substantially same layer as a layer on which the main bridge line mGBL and the contact region mGBL are disposed, and the main bridge line mGBL and the contact region mGBL may be formed in the same structure such that the areas overlapping the first initialization voltage line VL1 are equal to each other.

Consequently, because the plurality of input lines IL arranged in the main gate driving circuit GDCm are arranged to extend in also the sub-gate driving circuit GDCs, and the sub-gate signal output line sGL includes the same structure as a structure of the main gate signal output line mGL, a deviation between a parasitic capacitance formed in the sub-gate signal output line sGL and a parasitic capacitance formed in the main gate signal output line mGL may be reduced. Due to this structure, in the display apparatus according to an embodiment, a situation in which an initialization signal Sgi (see FIG. 9) output from the sub-gate driving circuit GDCs is erroneously applied to the pixel circuit may be prevented, and thus, an initialization voltage may be applied to each pixel circuit at an accurate timing. Accordingly, the display apparatus according to an embodiment may induce each pixel circuit to normally operate, and display excellent-quality images.

Because the display apparatus having the above construction according to an embodiment includes the corner display area, a region in which images are displayed may extend. Furthermore, because a deviation in a parasitic capacitance between the gate signal lines is reduced, the pixel circuits may operate normally and excellent-quality images may be displayed. However, this effect is an example, and the scope of the disclosure is not limited by this effect.

It should be understood that embodiments described herein should be considered in a descriptive sense only and not for purposes of limitation. Descriptions of features or aspects within each embodiment should typically be considered as available for other similar features or aspects in other embodiments. While embodiments have been described with reference to the figures, it will be understood by those of ordinary skill in the art that various changes in form and details may be made therein without departing from the spirit and scope as defined by the following claims.

What is claimed is:

1. A display apparatus comprising:
   a substrate including a pixel circuit area and a driving circuit region, wherein a pixel circuit is arranged in the pixel circuit area, and a driving circuit is arranged outside the pixel circuit and arranged in the driving circuit region;
   a sub-driving circuit portion including a sub-gate driving circuit, wherein the sub-driving circuit portion is disposed over the pixel circuit area when viewed in a direction perpendicular to the substrate;
   a main driving circuit portion arranged on a left side or a right side of the pixel circuit area when viewed in a direction perpendicular to the substrate, wherein the main driving circuit portion includes a main gate driving circuit arranged apart from the sub-gate driving circuit, and an emission driving circuit;
   a main gate signal output line configured to transfer a gate initialization signal from the main gate driving circuit to the pixel circuit;
   a sub-gate signal output line configured to transfer a gate initialization signal from the sub-gate driving circuit to the pixel circuit; and
   a plurality of input lines arranged between the main gate driving circuit and the pixel circuit and crossing the main gate signal output line,
   wherein the plurality of input lines extend to cross the sub-gate signal output line between the sub-gate driving circuit and the pixel circuit, and
   wherein a stage of the emission driving circuit and a stage of the main gate driving circuit, which are disposed in the same row, respectively supply the emission control signal to the pixel circuits disposed in one row and the gate initialization signal to the pixel circuits disposed in another row.

2. The display apparatus of claim 1, wherein the main driving circuit portion further includes a scan driving circuit.

3. The display apparatus of claim 2, wherein the scan driving circuit is arranged closer to an inside than the main gate driving circuit, and
   the emission driving circuit is arranged closer to an outside than the main gate driving circuit.

4. The display apparatus of claim 1, wherein the sub-gate driving circuit includes five to seven gate stages.

5. The display apparatus of claim 1, wherein the main driving circuit portion includes a first main driving circuit portion arranged on a left side of the pixel circuit area, and a second main driving circuit portion arranged on a right side of the pixel circuit area, and
   the sub-driving circuit portion includes a first sub-driving circuit portion arranged a left end of an upper region of the pixel circuit area, and a second sub-driving circuit portion arranged on a right end of the upper region of the pixel circuit area.

6. The display apparatus of claim 1, wherein the plurality of input lines include a plurality of scan clock lines.

7. The display apparatus of claim 6, wherein a scan clock line of the plurality of scan clock lines arranged between the main gate driving circuit and the pixel circuit includes a lower scan clock line and an upper scan clock line overlapping each other, and
   a scan clock line of the plurality of scan clock lines arranged between the sub-gate driving circuit and the pixel circuit is disposed on a substantially same layer as a layer on which the lower scan clock line is disposed.

8. The display apparatus of claim 6, wherein an area in which the main gate signal output line and the plurality of scan clock lines overlap each other is equal to an area in which the sub-gate signal output line and the plurality of scan clock lines overlap each other.

9. The display apparatus of claim 1, wherein the plurality of input lines include a gate voltage line and an initialization voltage line.

10. The display apparatus of claim 9, wherein the gate voltage line includes a gate-high voltage line and a gate-low voltage line, and
    the initialization voltage line includes a first initialization voltage line and a second initialization voltage line.

11. The display apparatus of claim 9, wherein the gate voltage line arranged between the main gate driving circuit and the pixel circuit is disposed on a same layer as a layer on which the gate voltage line arranged between the sub-gate driving circuit and the pixel circuit is disposed.

12. The display apparatus of claim 9, wherein the initialization voltage line arranged between the main gate driving circuit and the pixel circuit is disposed on a same layer as a layer on which the initialization voltage line arranged between the sub-gate driving circuit and the pixel circuit is disposed.

13. The display apparatus of claim 9, wherein an area in which the main gate signal output line and the gate voltage line overlap each other is equal to an area in which the sub-gate signal output line and the gate voltage line overlap each other.

14. The display apparatus of claim 9, wherein an area in which the main gate signal output line and the initialization voltage line overlap each other is equal to an area in which the sub-gate signal output line and the initialization voltage line overlap each other.

15. The display apparatus of claim 9, wherein the main gate signal output line includes a main bridge line overlapping the initialization voltage line and extending in a direction crossing a direction in which the main gate signal output line extends, and
    the sub-gate signal output line includes a sub-bridge line overlapping the initialization voltage line and extending in a direction crossing a direction in which the sub-gate signal output line extends.

16. The display apparatus of claim 15, wherein an area in which the main bridge line overlaps the initialization voltage line is equal to an area in which the sub-bridge line overlaps the initialization voltage line.

17. The display apparatus of claim 1, wherein the pixel circuit includes a first transistor including a polycrystalline semiconductor layer; and
    a third transistor including an oxide semiconductor layer.

18. The display apparatus of claim 17, further comprising:
    a first semiconductor layer disposed on the substrate and including a channel region of the first transistor;
    a first gate insulating layer disposed on the first semiconductor layer;
    a first gate electrode of the first transistor disposed on the first gate insulating layer and overlapping a channel of the first transistor;
    a first interlayer insulating layer disposed on the first gate electrode of the first transistor;
    a lower gate electrode of the third transistor disposed on the first interlayer insulating layer;
    a second interlayer insulating layer disposed on the lower gate electrode of the third transistor;
    a second semiconductor layer disposed on the second interlayer insulating layer and including a channel region of the third transistor;

a second gate insulating layer disposed on the second semiconductor layer;

an upper gate electrode of the third transistor disposed on the second gate insulating layer;

a third interlayer insulating layer covering the upper gate electrode of the third transistor;

a first source electrode of the first transistor disposed on the third interlayer insulating layer;

a first organic insulating layer disposed on the first source electrode; and a connection electrode disposed on the first organic insulating layer.

19. The display apparatus of claim 18, wherein the main gate signal output line and the sub-gate signal output line are disposed on a substantially same layer as a layer on which the lower gate electrode of the third transistor is disposed.

20. The display apparatus of claim 19, further comprising a plurality of gate signal connection lines connecting each of the main gate signal output line and the sub-gate signal output line to the pixel circuit, wherein the plurality of gate signal connection lines are disposed on a substantially same layer as a layer on which the upper gate electrode of the third transistor is disposed.

21. The display apparatus of claim 18, wherein the plurality of input lines include a scan clock line, a gate voltage line, and an initialization voltage line, wherein the scan clock line is disposed on a substantially same layer as a layer on which the first source electrode is disposed, and the gate voltage line and the initialization voltage line are disposed on a substantially same layer as a layer on which the connection electrode is disposed.

* * * * *